United States Patent
Furutani

(10) Patent No.: US 8,224,277 B2
(45) Date of Patent: Jul. 17, 2012

(54) SEMICONDUCTOR DEVICE

(75) Inventor: Kazuma Furutani, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 362 days.

(21) Appl. No.: 12/565,937

(22) Filed: Sep. 24, 2009

(65) Prior Publication Data

US 2010/0079203 A1    Apr. 1, 2010

(30) Foreign Application Priority Data

Sep. 26, 2008  (JP) ................... 2008-247548

(51) Int. Cl.
*H04B 1/06* (2006.01)
*H04B 7/00* (2006.01)

(52) U.S. Cl. ............. 455/252.1; 455/102; 455/107; 455/108; 455/110; 375/302; 375/305

(58) Field of Classification Search .......... 455/102, 455/107, 108, 110, 252.1; 375/302, 305
See application file for complete search history.

(56) References Cited

U.S. PATENT DOCUMENTS

| | | | |
|---|---|---|---|
| 6,855,957 B1 | 2/2005 | Yamazaki et al. | |
| 7,067,845 B2 | 6/2006 | Murakami et al. | |
| 7,102,231 B2 | 9/2006 | Yamazaki et al. | |
| 7,247,995 B2 | 7/2007 | Osame et al. | |
| 7,259,429 B2 | 8/2007 | Yamazaki | |
| 7,314,774 B2 | 1/2008 | Murakami et al. | |
| 7,417,256 B2 | 8/2008 | Yamazaki et al. | |
| 7,573,067 B2 | 8/2009 | Yamazaki | |
| 7,592,980 B2 | 9/2009 | Yamazaki et al. | |
| 2005/0221542 A1 | 10/2005 | Yamazaki et al. | |
| 2005/0280509 A1 | 12/2005 | Tanaka et al. | |
| 2006/0140305 A1* | 6/2006 | Netsell et al. ................. | 375/305 |
| 2007/0080374 A1 | 4/2007 | Kurokawa | |
| 2008/0094180 A1 | 4/2008 | Kato et al. | |
| 2008/0143531 A1 | 6/2008 | Tadokoro | |
| 2008/0150475 A1 | 6/2008 | Kato et al. | |
| 2008/0164478 A1 | 7/2008 | Murakami et al. | |
| 2008/0174408 A1 | 7/2008 | Takahashi | |
| 2008/0315205 A1 | 12/2008 | Yamazaki et al. | |
| 2008/0316034 A1* | 12/2008 | Fukushima et al. ....... | 340/572.1 |

FOREIGN PATENT DOCUMENTS

| | | |
|---|---|---|
| JP | 2006-5651 | 1/2006 |
| JP | 2006-180073 | 7/2006 |
| JP | 2007-183790 | 7/2007 |

* cited by examiner

*Primary Examiner* — Tuan Pham
(74) *Attorney, Agent, or Firm* — Husch Blackwell LLP

(57) ABSTRACT

An object is to provide a semiconductor device which operates normally even when the communication distance is extremely short, while the maximum communication distance is maintained, and which can make amplitude of a response waveform large even when a large amount of electric power is supplied to the semiconductor device and a protection circuit operates. The object is achieved with a semiconductor device including a first modulation circuit and a second modulation circuit each of which performs load modulation by an input signal, a detection circuit which determines an output signal by electric power supplied externally, a protection circuit which is controlled by the output signal of the detection circuit, and a modulation selecting circuit which switches the first modulation circuit and the second modulation circuit depending on the output signal of the detection circuit.

12 Claims, 10 Drawing Sheets

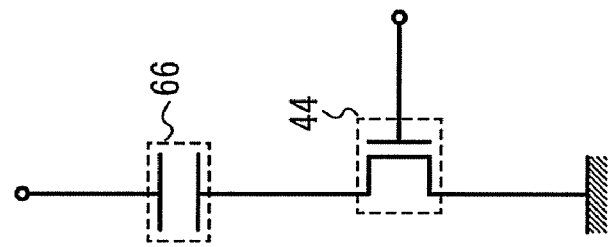
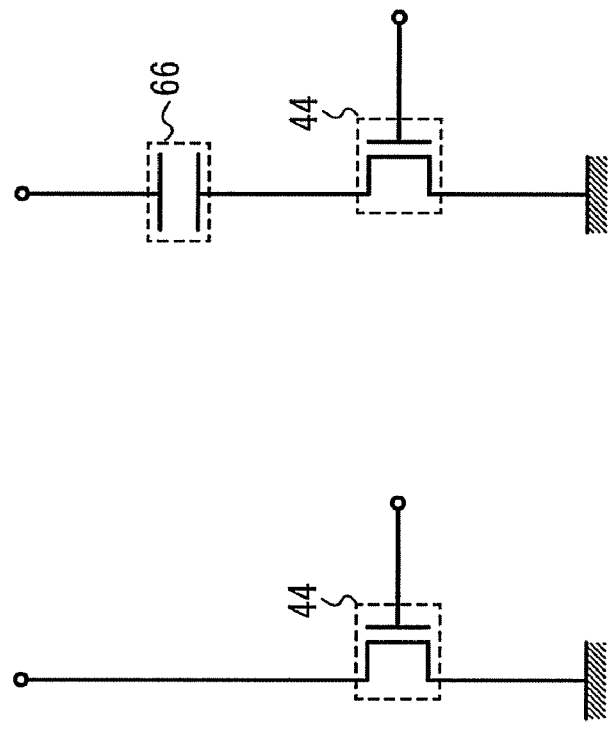
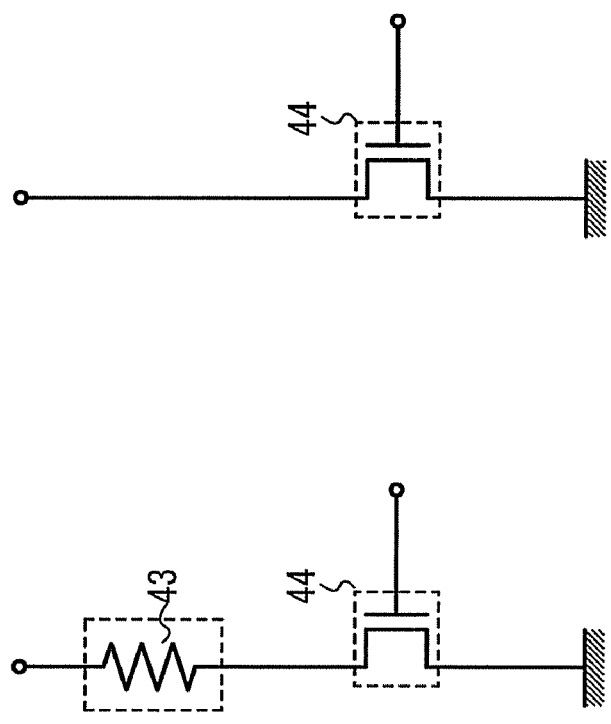

1001

1002

1003

1004

1007

SEMICONDUCTOR DEVICE

BACKGROUND OF THE INVENTION

1. Field of the Invention

The present invention relates to a semiconductor device. Specifically, the present invention relates to a semiconductor device for exchanging (receiving and transmitting) data by wireless communication. Further specifically, the present invention relates to a configuration of a modulation circuit which modulates data exchanged in a wireless communication.

2. Description of the Related Art

In recent years, an individual identification technology using wireless communication (hereinafter referred to as a wireless communication system) has attracted attention. In particular, an individual identification technology in which a semiconductor device utilizing an RFID (radio frequency identification) technology (also referred to as an RFID tag, an RF tag, an IC (integrated circuit) tag, an IC chip, a wireless tag, or an electronic tag) is used as a data carrier which exchanges data by wireless communication has attracted attention. The semiconductor device which can perform data reception and transmission wirelessly has started to be used for production, management, or the like of an individual object and has been developed to be applied to personal authentication.

The wireless communication system herein refers to a communication system in which date is wirelessly exchanged between a transceiver with a power supply source such as a reader/writer, and a transceiver such as a semiconductor device.

The wireless communication system does not need a physical connection between the reader/writer and the semiconductor device. That is, as log as the semiconductor device exists in a region specified by the reader/writer, the reader/writer communicates with the semiconductor device and data can be exchanged with the semiconductor device.

In order to extend the communication distance between the reader/writer and the semiconductor device, research and development for increasing a power supply efficiency from the reader/writer to the semiconductor device have been actively performed (for example, see Patent Document 1).

Meanwhile, in the wireless communication system, when data in a plurality of semiconductor devices is read by a reader/writer at the same time, a distance between the reader/writer and each semiconductor device (hereinafter referred to as a communication distance) is not the same. Further, the communication distance may change from time to time, such as in a case where a carton of products each provided with a semiconductor device is passed in front of a reader/writer using a forklift truck. In general, electric power is attenuated in proportion to the squared distance between a radiant point of electric power and a measurement point of the electric power. That is, although electric power supplied from the reader/writer to the semiconductor device varies depending on the communication distance, the semiconductor device needs to operate stably under different electric power conditions.

Therefore, particularly when the communication distance is extremely short, such as in the case where the reader/writer and the semiconductor device are in contact with each other, a large amount of electric power is supplied to the semiconductor device, whereas a sufficient amount of electric power is not supplied in the case where the communication distance is long. When a large amount of electric power is supplied to the semiconductor device, the semiconductor device cannot correctly demodulate a signal from the reader/writer and malfunctions, so that an internal element of the semiconductor device is deteriorated. In the worst case, there is a concern that the semiconductor device itself is destroyed.

On the contrary, there is a method in which a protection circuit is provided inside a semiconductor device in order to suppress deterioration and destruction of an element, and voltage which is greater than or equal to a certain voltage value is prevented from being applied to an element of the semiconductor device even when a large amount of electric power is supplied to the semiconductor device, by provision of the protection circuit which divides the electric power (for example, see Patent Document 2 and Patent Document 3).

CITATION LIST

[Patent Document 1] Japanese Published Patent Application No. 2006-5651
[Patent Document 2] Japanese Published Patent Application No. 2006-180073
[Patent Document 3] Japanese Published Patent Application No. 2007-183790

SUMMARY OF THE INVENTION

However, when such a protection circuit operates, amplitude of a response signal becomes small, whereby it is difficult for the reader/writer to recognize the response.

More specifically, in order that a modulation circuit operates so as to increase amplitude even when a protection circuit operates, electric power by which a modulation circuit operates properly needs to be also supplied to the modulation circuit. For that purpose, electric power which is divided to be supplied to the modulation circuit needs to be increased.

However, in this case, the amount of power supply to a logic circuit which generates a response signal and the like is decreased. As a result, there is a concern that the maximum communication distance of the semiconductor device is shortened.

An embodiment of the present invention is made in view of such difficulties. It is an object of the present invention to provide a semiconductor device which operates normally even when the communication distance is extremely short, while the maximum communication distance is maintained, and which can increase amplitude of a response waveform when a large amount of electric power is supplied to the semiconductor device and a protection circuit operates.

In order to achieve the above object, in a semiconductor device according to an embodiment of the present invention, modulation circuits are switched. Specifically, the semiconductor device of the present invention includes a rectifier circuit which is connected to an antenna terminal, a detection circuit which determines an output state by a value of voltage output from the rectifier circuit, a switching element which is included in a protection circuit and becomes conductive or non-conductive depending on an output of the detection circuit, a modulation selecting circuit which determines its output by the output of the detection circuit and a modulation signal, a first modulation circuit which is used when the switching element is in a non-conductive state, and a second modulation circuit which is used when the switching element is in a conductive state. The first modulation circuit is used to perform load modulation when the switching element is in a non-conductive state, while the second modulation circuit is used to perform load modulation when the switching element is in a conductive state.

Further, a semiconductor device according to another embodiment of the present invention includes an antenna, a rectifier circuit which is connected to the antenna, a detection circuit which determines an output state by a value of voltage output from the rectifier circuit, a switching element which is included in a protection circuit and becomes conductive or non-conductive depending on an output of the detection circuit, a passive element, a modulation selecting circuit which determines its output by the output of the detection circuit and a modulation signal, a first modulation circuit which is used when the switching element is in a non-conductive state, a second modulation circuit which is used when the switching element is in a conductive state, a constant voltage circuit which makes output voltage of the rectifier circuit constant, a clock generation circuit, a demodulation circuit which digitizes an amplitude modulation wave received by the antenna, and a logic circuit which analyzes a signal which is digitized in the demodulation circuit and outputs a response signal. The first modulation circuit is used to perform load modulation when the switching element is in a non-conductive state, while the second modulation circuit is used to perform load modulation when the switching element is in a conductive state.

Further, a semiconductor device according to another embodiment of the present invention includes a first modulation circuit and a second modulation circuit each of which performs load modulation by an input signal, a detection circuit whose operation determines an output signal by electric power supplied externally, a protection circuit which is controlled by the output signal of the detection circuit, and a modulation selecting circuit. The modulation selecting circuit switches the first modulation circuit and the second modulation circuit depending on the output signal of the detection circuit.

The modulation selecting circuit has a function of selecting the first modulation circuit when the protection circuit does not operate and selecting the second modulation circuit when the protection circuit operates.

Furthermore, a semiconductor device according to another embodiment of the present invention includes a first modulation circuit and a second modulation circuit each of which performs load modulation by an input signal, an antenna terminal to which alternating-current voltage is input from external, a rectifier circuit which converts the alternating-current voltage into direct-current voltage, a detection circuit which determines an output signal by a value of voltage output from the rectifier circuit, a modulation selecting circuit which switches the first modulation circuit and the second modulation circuit depending on the output signal of the detection circuit, and a protection circuit which suppresses output voltage of the rectifier circuit by the output signal of the detection circuit. The modulation selecting circuit selects the first modulation circuit when the direct-current voltage converted in the rectifier circuit is lower than operation start voltage of the protection circuit. On the other hand, the modulation selecting circuit makes the protection circuit operate and selects the second modulation circuit when the direct-current voltage is higher than the operation start voltage of the protection circuit.

The second modulation circuit increases amplitude of a subcarrier wave which is generated by load modulation of the second modulation circuit and which is made to be small due to operation of the protection circuit. A load included in the second modulation circuit is smaller than that included in the first modulation circuit.

Note that in this specification, "connection" means "electrical connection" unless otherwise described.

In this specification, as a transistor, a transistor of any mode can be used. Therefore, there is no limitation on kinds of applicable transistors. Thus, a thin film transistor (TFT) including a non-single-crystal semiconductor film typified by non-crystalline silicon or polycrystalline silicon can be used. Alternatively, a transistor formed using a semiconductor substrate or an SOI substrate, a MOS transistor, a junction transistor, a bipolar transistor, a transistor including a compound semiconductor such as ZnO or a-InGaZnO, a transistor including an organic semiconductor or a carbon nanotube, or other transistors can be used. Note that a non-single-crystal semiconductor film may include hydrogen or halogen. In addition, a variety of types of substrates can be used for a substrate to which transistors are arranged, without limitation on a certain type of substrate. Therefore, for example, a transistor can be provided over a single crystal substrate, an SOI substrate, a glass substrate, a quartz substrate, a plastic substrate, a paper substrate, a cellophane substrate, a stone substrate, a wood substrate, or the like. Further, the transistor may be formed using one substrate, and then, the transistor may be transferred to another substrate.

When circuits are formed over one substrate, cost can be reduced by reduction in the number of components, and reliability can be improved by reduction in the number of connection points with other circuit components. Alternatively, part of circuits may be formed over one substrate and other parts of the circuits may be formed over another substrate. In other words, not all of the circuits are necessary to be formed over one substrate. For example, part of the circuits may be formed using transistors over a glass substrate, and the other part of the circuits may be formed as an IC chip over a single crystal substrate, and then the IC chip may be connected by COG (chip on glass) so as to be disposed over the glass substrate. Alternatively, the IC chip may be connected to the glass substrate using TAB (tape auto bonding) or a printed wiring board. In this manner, by forming part of the circuits over the same substrate, the number of component parts can be reduced to reduce cost, and the number of connection points between the circuits and the components can be reduced to improve reliability. In addition, when parts of circuits, which have high driving voltage, and parts of circuits, which have high driving frequency, are formed over different substrates, increase in power consumption can be prevented.

A transistor applied to a semiconductor device according to an embodiment of the present invention may have, for example, a multi-gate structure which includes two or more gates. With the multi-gate structure, off-current can be reduced and reliability can be improved by increasing the withstand voltage of the transistor, and current between a source terminal and a drain terminal is not changed so much even if voltage between the source terminal and the drain terminal is changed when operation is performed in a saturation region; therefore, flat characteristics can be achieved. In addition, a structure in which gate electrodes are provided above and below a channel may be employed. By employing the structure in which gate electrodes are provided above and below a channel, a channel region is increased, so that the amount of current can be increased and a subthreshold swing can be reduced because a depletion layer is easily formed. Moreover, any structure of the following may be also employed: a structure in which a gate electrode is disposed above the channel, a structure in which a gate electrode is disposed below the channel, a staggered structure, or an inverted staggered structure. A channel region may be divided into a plurality of regions, and the divided channel regions may be connected in parallel or in series. Further, a source or drain electrode may be overlapped with a channel region (or part thereof). By employing the structure in which a source or drain electrode is overlapped with a channel region (or a part thereof), operational instability due to charge accumulation in part of a channel can be prevented. Further, an LDD region may be provided in a source region or a drain region. By provision of an LDD region, off-current can be reduced and reliability can be improved by increasing the withstand voltage of the transistor, and current between a source terminal and a drain terminal is not changed so much even if voltage between a source terminal and a drain terminal is changed when operation is performed in a saturation region, so that flat characteristics can be achieved.

Even in the case where a large amount of electric power is supplied to the semiconductor device, a defect of the semiconductor device is prevented and amplitude of a response signal is increased when the protection circuit operates, whereby a wireless communication range with a reader/writer can be improved.

BRIEF DESCRIPTION OF THE DRAWINGS

In the accompanying drawings:

FIGS. 7A to 7C are diagrams each illustrating a semiconductor device according to an embodiment of this invention;

DETAILED DESCRIPTION OF THE INVENTION

Figure 1:
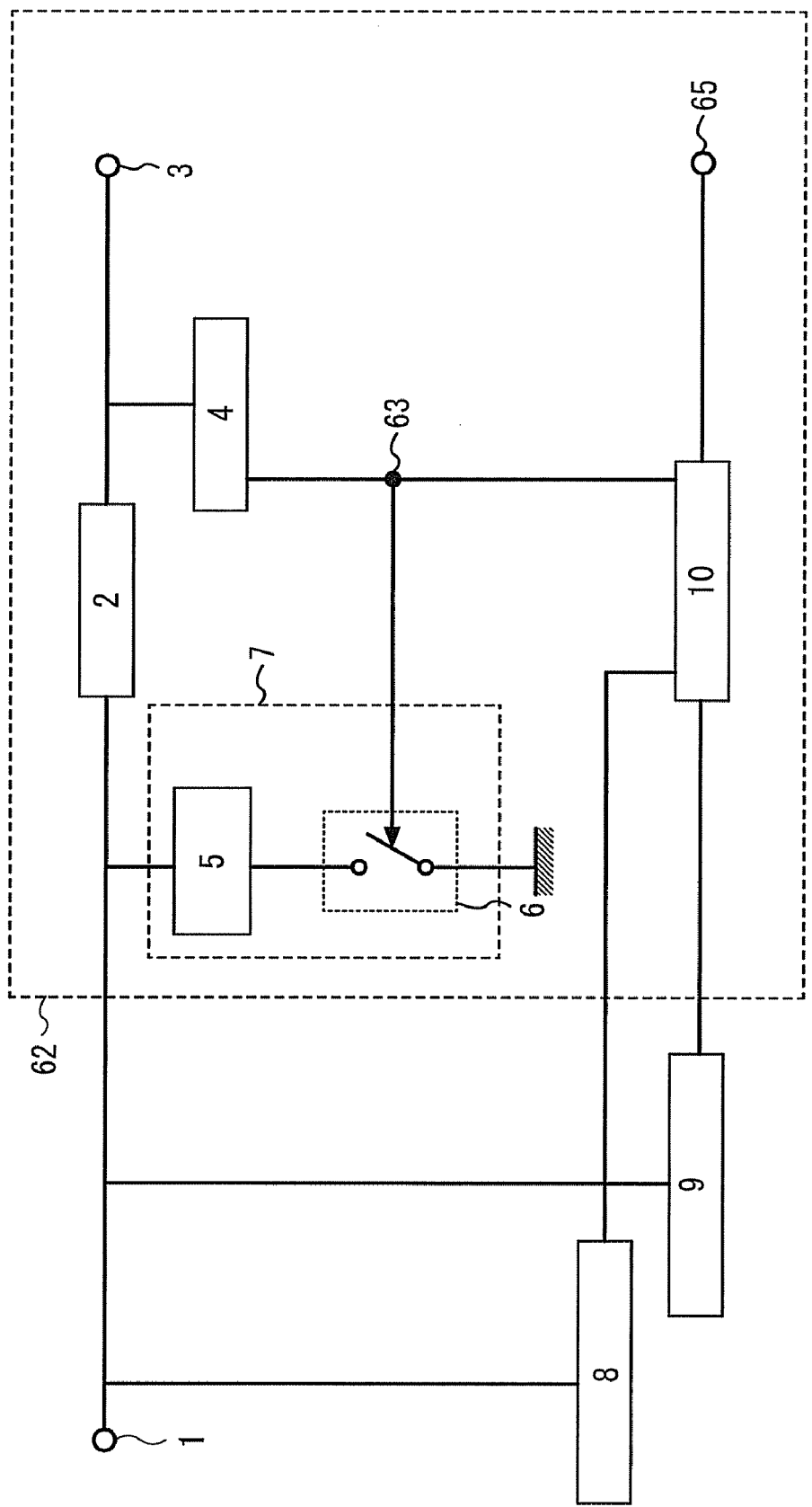
FIG. 1 is a diagram illustrating a semiconductor device according to an embodiment of the present invention.

Embodiments of the present invention are explained with reference to the drawings. Note that the present invention is not limited to the following description and it is easily understood by those skilled in the art that the modes and details disclosed herein can be modified in various ways without departing from the spirit and the scope of the invention. Therefore, the present invention should not be interpreted as being limited to the description in the following embodiments. Note that in the structures of the present invention to be explained below, the reference numerals including same part are used in common in different drawings.

Embodiment 1

In Embodiment 1, one example of a structure and operation of a semiconductor device according to an embodiment of the present invention is described with reference to drawings.

As illustrated in FIG. 1, the semiconductor device described in Embodiment 1 includes an antenna terminal 1, a rectifier circuit 2, an output terminal 3 of the rectifier circuit, a detection circuit 4, a protection circuit 7 including a passive element 5 and a switching element 6, a first modulation circuit 8, a second modulation circuit 9, a modulation selecting circuit 10, an output terminal 63 of the detection circuit, and a modulation signal input terminal 65. The first modulation circuit 8 operates when the protection circuit 7 does not operate. Influence of whether the first modulation circuit 8 operates or not appears as the amount of change in voltage in the antenna terminal 1. By the influence by the amount of change in voltage, a subcarrier wave is generated from an antenna. On the other hand, the second modulation circuit 9 operates when the protection circuit 7 operates. Influence of whether the second modulation circuit 9 operates or not appears as the amount of change in voltage in the antenna terminal 1. By the influence by the amount of change in voltage, a subcarrier wave is generated from an antenna.

The antenna terminal 1 can be connected to an antenna, for example, where electric power received by the antenna is supplied.

The rectifier circuit 2 converts alternating-current voltage input to the antenna terminal 1 into direct-current voltage and outputs the voltage to the output terminal 3 of the rectifier circuit and to the detection circuit 4. The rectifier circuit 2 can be formed using a half-wave rectifier circuit, a half-wave voltage-doubler rectifier circuit, a full-wave rectifier circuit, a Cockcroft circuit, or the like. The rectifier circuit herein refers to an AC/DC converter circuit which converts alternating current into direct current. The detection circuit 4 determines an output signal in accordance with electric power received by an antenna from external. More specifically, alternating-current voltage supplied from external is converted into direct-current voltage by the rectifier circuit 2, and the detection circuit 4 determines the output signal in accordance with a value of the direct-current voltage output from the rectifier circuit 2. Then, one of the first modulation circuit 8 and the second modulation circuit 9 is selected in accordance with the output signal of the detection circuit 4.

Next, a structure of the semiconductor device of Embodiment 1, which includes specific circuit configurations of the rectifier circuit 2 and the detection circuit 4 illustrated in FIG. 1, is described with reference to FIG. 3. The semiconductor device includes the antenna terminal 1, the rectifier circuit 2, the detection circuit 4, the protection circuit 7, the first modulation circuit 8, the second modulation circuit 9, the modulation selecting circuit 10, a demodulation circuit 11, a constant voltage circuit 12, a clock generation circuit 13, and a logic circuit 18. The detection circuit 4 includes a resistor 20, a four-stage diode 21, a p-channel transistor 22, and an n-channel transistor 23. The rectifier circuit 2 includes a capacitor 24, a diode 25, a diode 26, a capacitor 27, and a resistor 28. As a transistor which can be used in each circuit, for example, a thin film transistor (TFT) can be given. The detection circuit 4 has a function of controlling conduction or non-conduction of the switching element 6, which is an n-channel transistor 29 in FIG. 3, in accordance with a value of direct-current voltage output from the rectifier circuit 2.

Figure 3:
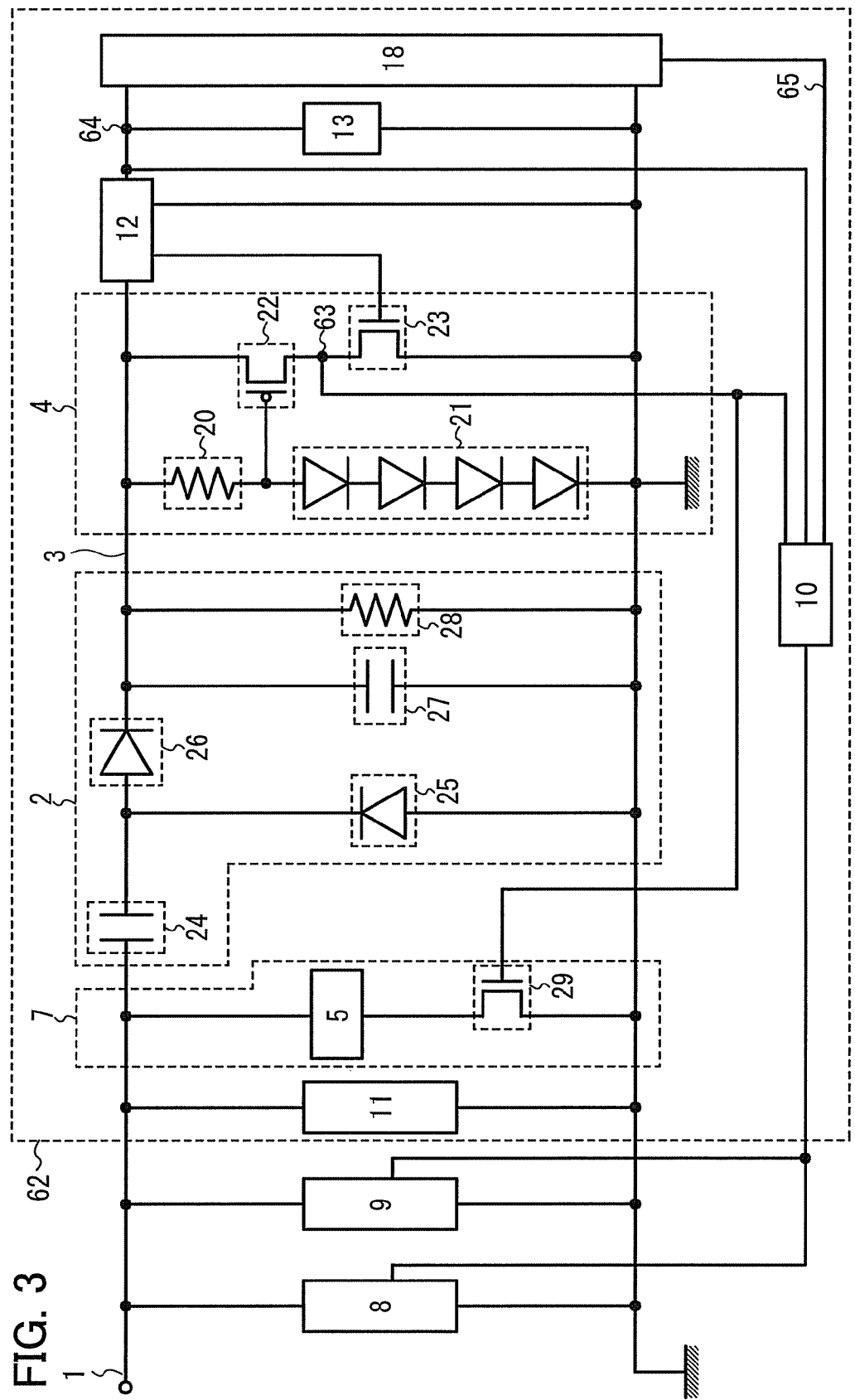
FIG. 3 is a diagram illustrating a semiconductor device according to an embodiment of the present invention.

Next, operation of the detection circuit 4 illustrated in FIG. 3 is described. When direct-current voltage output from the output terminal 3 of the rectifier circuit is low and the four-stage diode 21 is not in a conductive state, the n-channel transistor 23 is in a conductive state by a Vbias, which is output from a reference circuit in the constant voltage circuit 12 and applied to a gate electrode of the n-channel transistor 23, whereby gate voltage of the p-channel transistor 22 becomes close to a potential of the output terminal 3 of the rectifier circuit, and the p-channel transistor 22 is in a non-conductive state since gate-source voltage of the p-channel transistor is higher than the threshold voltage. Therefore, the potential of the output terminal 63 of the detection circuit becomes a GND potential. In this case, if the output terminal 63 of the detection circuit is connected to a gate of an n-channel transistor 29 (here, the n-channel transistor 29 is used as the switching element 6 for explanatory convenience), gate-source voltage of the n-channel transistor 29 is lower than the threshold voltage. Accordingly, the n-channel transistor 29 is in a non-conductive state. When the direct-current voltage output from the output terminal 3 of the rectifier circuit is large and the four-stage diode 21 is in a conductive state, current begins to flow to the resistor 20 and a voltage drop occurs. A generated potential difference between the voltage of the output terminal 3 of the rectifier circuit and the voltage drop becomes lower than the threshold voltage of the p-channel transistor 22, so that the p-channel transistor 22 becomes conductive, whereby a potential of the output terminal 63 of the detection circuit begins to increase. When gate-source voltage of the n-channel transistor 29 becomes higher than the threshold voltage, the n-channel transistor 29 is in a conductive state. In addition, when the voltage of the output terminal 3 of the rectifier circuit becomes high, voltage which is much lower than the threshold voltage is applied between the gate and the source of the p-channel transistor. On the other hand, since a constant voltage VDD, which is an output of the constant voltage circuit 12, is applied to the gate terminal of the n-channel transistor 23, the resistance of the n-channel transistor 23 becomes much larger than that of the p-channel transistor 22. Then, the potential of the output terminal 63 of the detection circuit further increases to be closer to that of the output terminal 3 of the rectifier circuit. Also in this case, the n-channel transistor 29 is in a conductive state.

The resistor 20 and the four-stage diode 21 in the above-described detection circuit 4 are described. Output voltage of the rectifier circuit, at which current begins to flow to the four-stage diode 21, is determined by the number of diodes connected in series and a threshold value of the diode. A voltage division ratio between the four-stage diode 21 and the resistor 20 is determined by a resistance value of the resistor 20. That is, operation start voltage (Vx) of the protection circuit 7 is determined by the number of diodes connected in series, the threshold value of the diode, and the resistance value of the resistor 20.

The four-stage diode 21 in the detection circuit 4 is not limited to a structure in which the four diodes are connected in series, and the number of diodes may be set as appropriate depending on application. For example, a structure in which a plurality of diodes is connected, such as a three-stage diode or a five-stage diode, may be used.

Figure 5:
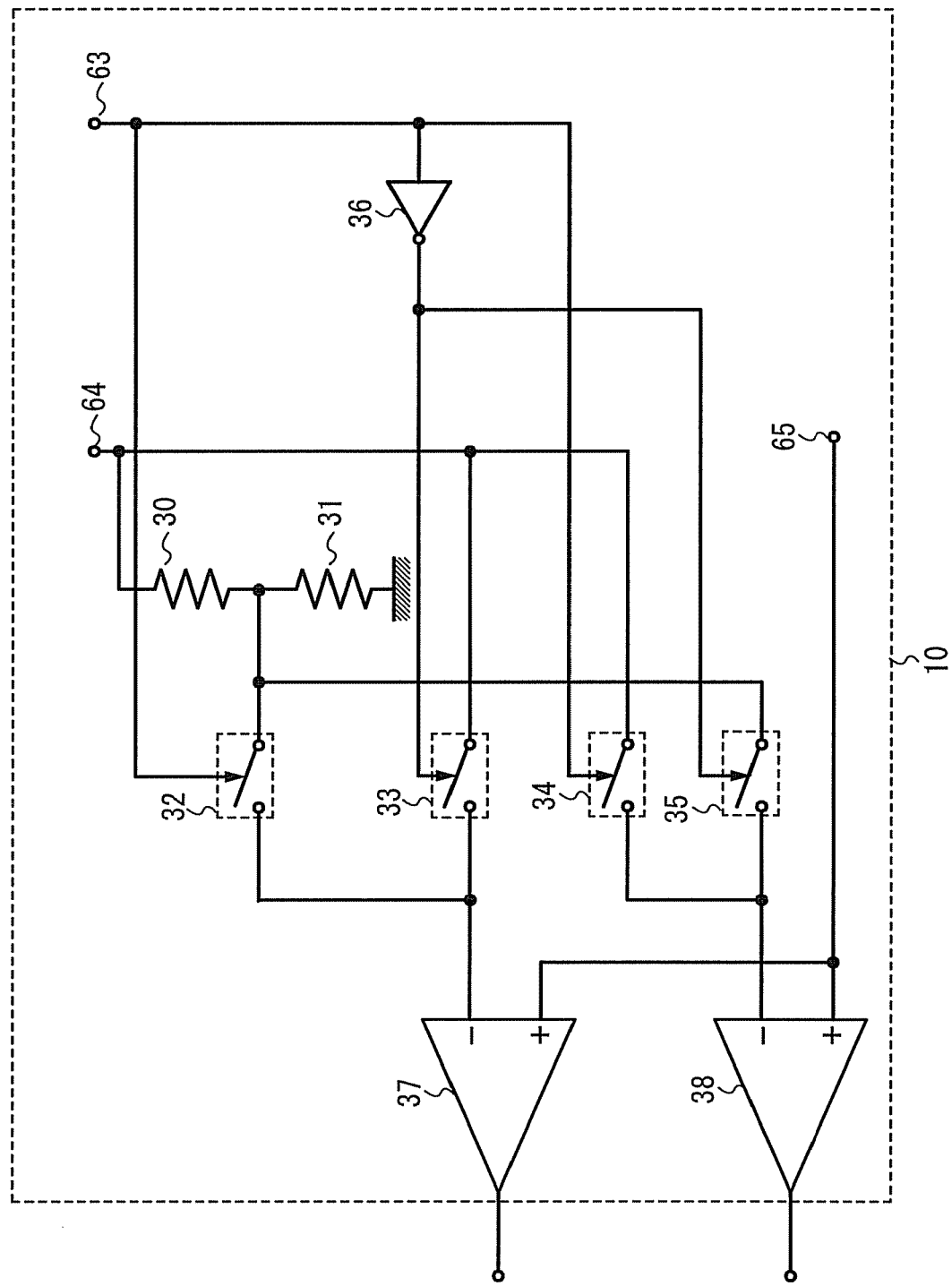
FIG. 5 is a diagram illustrating a semiconductor device according to an embodiment of the present invention.

A specific configuration of the modulation selecting circuit 10 illustrated in FIG. 3 is described with reference to FIG. 5. The modulation selecting circuit 10 in FIG. 5 has a function of selecting either the first modulation circuit 8 or the second modulation circuit 9 in accordance with a voltage value of direct-current voltage output from the detection circuit 4. The modulation selecting circuit 10 may include a first resistor 30, a second resistor 31, a switch 32, a switch 32, a switch 33, a switch 34, a switch 35, an inverter 36, a comparator 37, and a comparator 38, for example. Note that each of the switches 32 to 35, the inverter 36, and the comparators 37 and 38, which are illustrated in FIG. 5, may be formed using a transistor. As the transistor, a thin film transistor (TFT) may be used, for example.

Next, operation of the modulation selecting circuit 10 illustrated in FIG. 5 is described. Here, in the modulation selecting circuit 10 described above, a resistance value of the first resistor 30 is defined as R1, a resistance value of the second resistor 31 is defined as R2, and a voltage value of an output terminal 64 of the constant voltage circuit is defined as VDD. When the protection circuit 7 does not operate, a potential of the output terminal 63 of the detection circuit is at a low level and the switch 33 and the switch 35 become conductive; therefore, VDD voltage is supplied to a minus terminal of the comparator 37 and R2/(R1+R2)·VDD voltage is supplied to a minus terminal of the comparator 38. In this state, if a modulation signal is not input to plus terminals of the comparator 37 and the comparator 38, the comparator 37 and the comparator 38 do not output a modulation signal to the modulation circuit; on the other hand, if a modulation signal is input to the plus terminals of the comparator 37 and the comparator 38, the comparator 37 does not output a modulation signal to the second modulation circuit 9 whereas the comparator 38 outputs a modulation signal to the first modulation circuit 8. When the protection circuit 7 operates, a potential of the output terminal 63 of the detection circuit is at a high level and the switch 32 and the switch 34 are in a conductive state; therefore, R2/(R1+R2)·VDD voltage is supplied to the minus terminal of the comparator 37 and VDD voltage is supplied to the minus terminal of the comparator 38. In this state, if a modulation signal is not input to plus terminals of the comparator 37 and the comparator 38, the comparator 37 and the comparator 38 do not output a modulation signal to the modulation circuit; on the other hand, if a modulation signal is input to the plus terminals of the comparator 37 and the comparator 38, the comparator 38 does not output a modulation signal to the first modulation circuit 8 whereas the comparator 37 outputs a modulation signal to the second modulation circuit 9.

In the modulation selecting circuit 10, a resistance value of the first resistor 30 is defined as R1, a resistance value of the second resistor 31 is defined as R2, output voltage of the constant voltage circuit is defined as VDD, a voltage value when the modulation signal is at a high level is defined as V_Hi, and a voltage value when the modulation signal is at a low level is defined as V_Low. The modulation selecting circuit 10 is needed to be designed so as to satisfy V_Low<R2/(R1+R2)·VDD<V_Hi·VDD in order to have the above-described function. In addition, the resistance value R1 of the first resistor 30 and the resistance value R2 of the second resistor 31 are designed so as to satisfy (V_Hi−V_Low)/2=R2/(R1+R2)·VDD, whereby malfunction of the modulation selecting circuit 10 due to variation in element characteristics caused in the manufacturing process can be reduced as much as possible.

Figure 6:
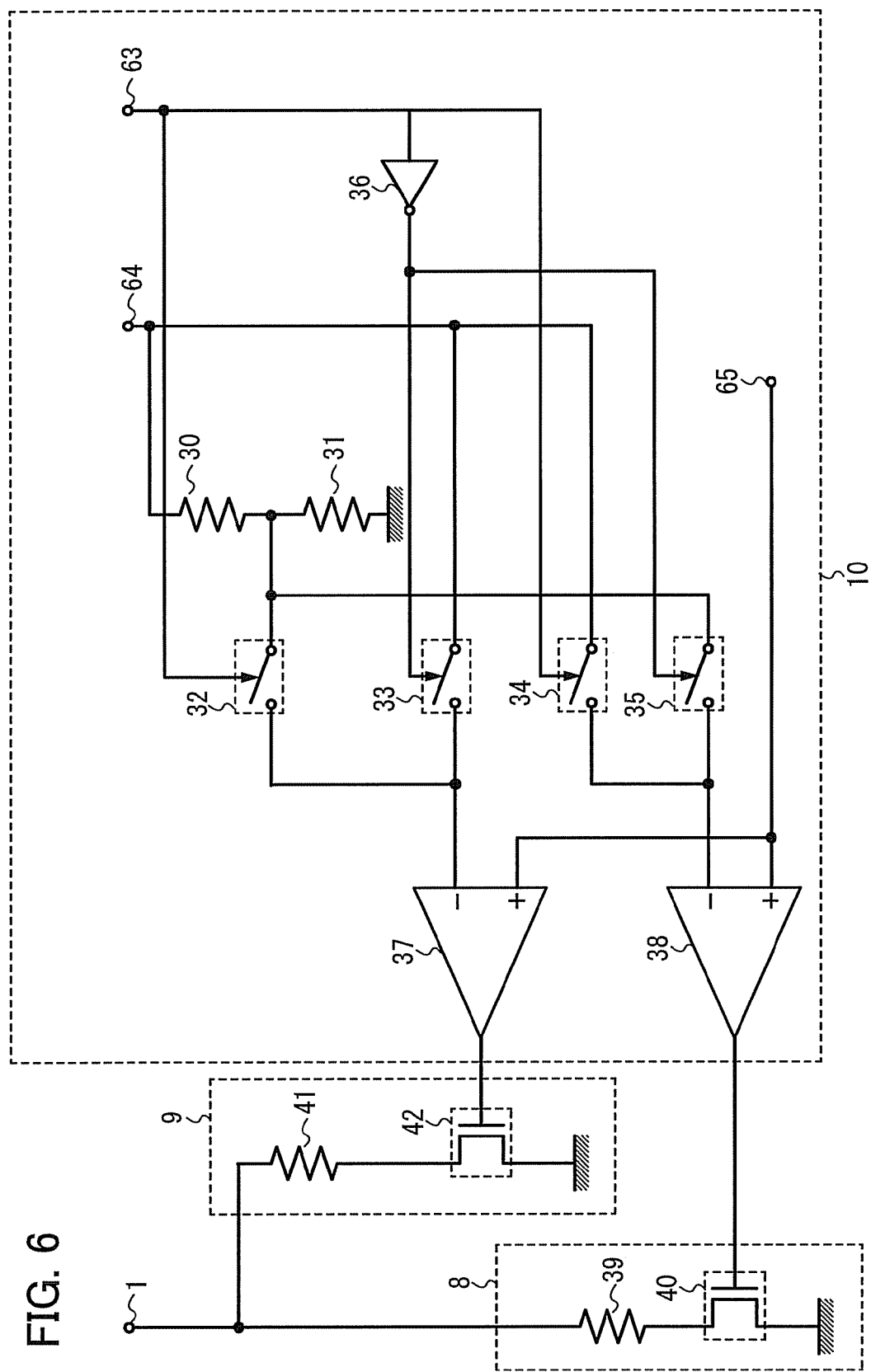
FIG. 6 is a diagram illustrating a semiconductor device according to an embodiment of the present invention.

A specific configuration example of the modulation selecting circuit 10 illustrated in FIG. 5 and the first modulation circuit 8 and the second modulation circuit 9 which are connected to the modulation selecting circuit 10 is described with reference to FIG. 6. The first modulation circuit 8 includes a resistor 39 and an n-channel transistor 40. The second modulation circuit 9 includes a resistor 41 and an n-channel transistor 42. The first modulation circuit 8 has a function of controlling ON/OFF of the n-channel transistor 40 using a modulation signal input from the logic circuit 18 through the comparator 38. Although FIG. 6 illustrates an example in which the resistor 43 and the n-channel transistor 44 are used in the configuration of the first modulation circuit 8 as shown in FIG. 7A, a configuration in which load modulation is performed by the n-channel transistor 44 without a resistor as shown in FIG. 7B may be employed. Alternatively, as shown in FIG. 7C, a capacitor 66 may be used instead of the resistor 43 to form the modulation circuit. As each transistor, for example, a thin film transistor (TFT) can be used.

Next, operation of the first modulation circuit 8 which includes the resistor 39 and the n-channel transistor 40 in FIG. 6 is described. A modulation signal is input to a gate of the n-channel transistor 40 from an output terminal of the modulation selecting circuit 10. Depending on an input level, the n-channel transistor 40 is in a conductive state or a non-conductive state. When the n-channel transistor 40 is in a non-conductive state, current does not flow to the resistor 39 and the n-channel transistor 40, so that current flowing from the antenna terminal 1 flows to the second modulation circuit 9 and a load 62. When the n-channel transistor 40 is in a conductive state, current flowing from the antenna terminal 1 is divided to flow to the first modulation circuit 8 and the load 62. It is defined that current flowing to the first modulation circuit 8 is I1 and current flowing to the load 62 is Ir. When I1 is larger than Ir, the amount of change in chip impedance from the antenna terminal 1 is larger.

The second modulation circuit 9 has a function of controlling ON/OFF of the n-channel transistor using a modulation signal input from the logic circuit 18 through the comparator 37. Although FIG. 6 illustrates an example in which the resistor 43 and the n-channel transistor 44 are used in the configuration of the second modulation circuit 9 as shown in FIG. 7A, load modulation may be performed by the n-channel transistor 44 without a resistor as shown in FIG. 7B. Alternatively, as shown in FIG. 7C, a capacitor 66 may be used instead of the resistor 43 to form the modulation circuit. As each transistor, for example, a thin film transistor (TFT) can be used.

Next, operation of the second modulation circuit 9 which includes the resistor 41 and the n-channel transistor 42 as shown in FIG. 6 is described. A modulation signal is input to a gate of the n-channel transistor 42 from an output terminal of the modulation selecting circuit. Depending on input level, the n-channel transistor 42 is in a conductive state or a non-conductive state. When the n-channel transistor 42 is in a non-conductive state, current does not flow to the resistor 41 and the n-channel transistor 42, so that current flowing from the antenna terminal 1 flows to the first modulation circuit 8 and the load 62. When the n-channel transistor 42 is in a conductive state, current flowing from the antenna terminal 1 is divided to flow to the second modulation circuit 9 and the load 62. It is defined that current flowing to the second modulation circuit 9 is I2 and current flowing to the load 62 is Ir. When I2 is larger than Ir, the amount of change in chip impedance from the antenna terminal 1 is larger.

The first modulation circuit 8 and the second modulation circuit 9 may have the same configuration or different configurations.

A parameter which determines amplitude of a response signal is described with reference to FIGS. 7A to 7C. A drain-source current Id in a saturation region of the n-channel transistor 44 illustrated in FIGS. 7A to 7C can be obtained by a formula below.

$$Id = \tfrac{1}{2} \cdot K' \cdot W/L \cdot (Vgs - Vt)^2 \cdot (1 + \lambda \cdot Vds) \qquad \text{[Formula 1]}$$

K' represents the product of electron mobility and capacitance of a gate oxide film per unit area. Moreover, λ, W, L, Vgs, Vt, and Vds represent a channel length modulation coefficient, a channel width, a channel length, gate-source voltage, the threshold voltage, and drain-source voltage, respectively. In order to increase the amplitude of the response signal, a resistance value of the modulation circuit is determined to be small so that current flowing to the modulation circuit is increased. In addition, each parameter which determines drain current of the n-channel transistor 44 is determined so that the drain current is increased.

The magnitude of the amplitude of the response signal when the protection circuit 7 does not operate is determined by a ratio between current flowing to the first modulation circuit 8 and current flowing to the load 62 when the modulation signal is at a high level. Further, the magnitude of the amplitude of the response signal when the protection circuit 7 operates is determined by a ratio between current flowing to the second modulation circuit 9 and current flowing to the load 62. In order to increase the magnitude of a response waveform, a ratio between an impedance Z1 of the modulation circuit and an impedance Z2 of the load when the modulation signal is at a high level is determined so that a large amount of current flows to the modulation circuit. Note that the impedance Z2 of the load differs in the cases where the protection circuit 7 operates and where the protection circuit 7 does not operate. Therefore, the first modulation circuit 8 and the second modulation circuit 9 are needed to be designed in consideration thereof.

A description is made on, for example, a method for setting parameters of the resistor 39 and the n-channel transistor 40 which are included in the first modulation circuit 8 and the resistor 41 and the n-channel transistor 42 which are included in the second modulation circuit 9 by employing the first modulation circuit 8 including the resistor 39 and the n-channel transistor 40 and the second modulation circuit 9 including the resistor 41 and the n-channel transistor 42, which are described in FIG. 6. For example, a resistance value of the resistor 39 of the first modulation circuit 8 is defined as R3 and a resistance value of the resistor 41 of the second modulation circuit 9 is defined as R4. The resistance values are determined to satisfy R3<R4, whereby the amplitude of a response signal when the protection circuit operates can be increased. Further, current which flows to the n-channel transistor 40 included in the first modulation circuit 8 is defined as ID1 and current which flows to the n-channel transistor 42 included in the second modulation circuit 9 is defined as ID2. A parameter K' which determines the drain current of the n-channel transistor, and a channel length modulation coefficient λ, a channel width W, a channel length L, a gate-source voltage Vgs, the threshold voltage Vt, and a drain-source voltage Vds are determined to satisfy ID2>ID1, so that the amplitude of a response signal when the protection circuit 7 operates can be increased. Note that when the current ID2 which flows to the second modulation circuit 9 is increased too much so as to increase the amplitude of a response signal, the current which flows to the load 62 decreases, whereby current necessary for operating the logic circuit 18 is not supplied. In this case, the logic circuit 18 does not operate; therefore, it is necessary to be careful.

There is no particular limitation on the switching element 6 as long as it can control electrical connection between the antenna terminal 1 and the passive element 5. As for the switching element 6, the propagation delay time is preferably short and the noise due to high-speed switching is preferably small. For example, the switching element 6 can be formed using a transistor, a thyristor, or the like.

The passive element 5 can be formed using a resistor or a capacitor.

Although the protection circuit 7 has a configuration including the passive element 5 and the switching element 6, a configuration including only the switching element 6 may be employed.

Next, operation of the semiconductor device in Embodiment 1 is described with reference to FIG. 3 and FIG. 6.

Alternating-current voltage is input to the antenna terminal 1, whereby the rectifier circuit 2 converts the alternating-current voltage into direct-current voltage and outputs the direct-current voltage to the detection circuit 4. In the case where the direct-current voltage input to the detection circuit 4 is below a predetermined voltage value (Vx), the switching element 6 remains in an OFF state (the state in which the passive element 5 and the GND are electrically isolated from each other), so that the protection circuit 7 remains non-operated and the modulation selecting circuit 10 remains in a state in which the first modulation circuit 8 is selected and the second modulation circuit 9 is not selected. As a result, the alternating-current voltage input to the antenna terminal 1 is converted into the direct-current voltage by the rectifier circuit 2 to be applied to the output terminal 3 of the rectifier circuit. In this state, the modulation signal is output to the comparators 37 and 38, whereby load modulation is performed using the first modulation circuit 8.

On the other hand, in the case where the direct-current voltage input to the detection circuit 4 is at or above the predetermined voltage value (Vx), the switching element 6 remains in an ON state (the state in which the passive element 5 and the GND are electrically connected to each other), so that the protection circuit 7 operates and the modulation selecting circuit 10 selects not the first modulation circuit 8 but the second modulation circuit 9. As a result, current flows to GND from the antenna terminal 1 to GND through the passive element 5 and the switching element 6 and voltage generated in the rectifier circuit 2 is suppressed; therefore, circuits including the rectifier circuit 2, which are connected to the output terminal 3 of the rectifier circuit, are protected. In addition, the alternating-current voltage input to the antenna terminal 1 is converted into the direct-current voltage by the rectifier circuit 2 to be applied to the output terminal 3 of the rectifier circuit. In this state, the modulation signal is input to the comparators 37 and 38, whereby load modulation is performed using the second modulation circuit 9.

There is a correlation between the alternating-current voltage input to the antenna terminal 1 and the direct-current voltage output from the rectifier circuit 2. As the alternating-current voltage input to the antenna terminal 1 is increased, the output voltage of the rectifier circuit 2 is increased. In the case where voltage output from the rectifier circuit 2 is at or above a predetermined value, there is a concern that circuits including the rectifier circuit 2, which are connected to the output terminal 3 of the rectifier circuit, are damaged. Therefore, by provision of the protection circuit 7, in the case where high alternating-current voltage is supplied to the antenna terminal 1, current flows from the antenna terminal 1 to GND through the passive element 5 and the switching element 6, and the output voltage of the rectifier circuit 2 is suppressed, whereby the circuits including the rectifier circuit 2, which are connected to the output terminal 3 of the rectifier circuit, are protected.

Note that Embodiment 1 can be implemented in combination with the structure of any semiconductor device described in any other embodiments in this specification.

Embodiment 2

In Embodiment 2, an example where a semiconductor device according to an embodiment of the present invention is provided as a wireless tag which can transmit and receive date wirelessly is described with reference to drawings.

Figure 2:
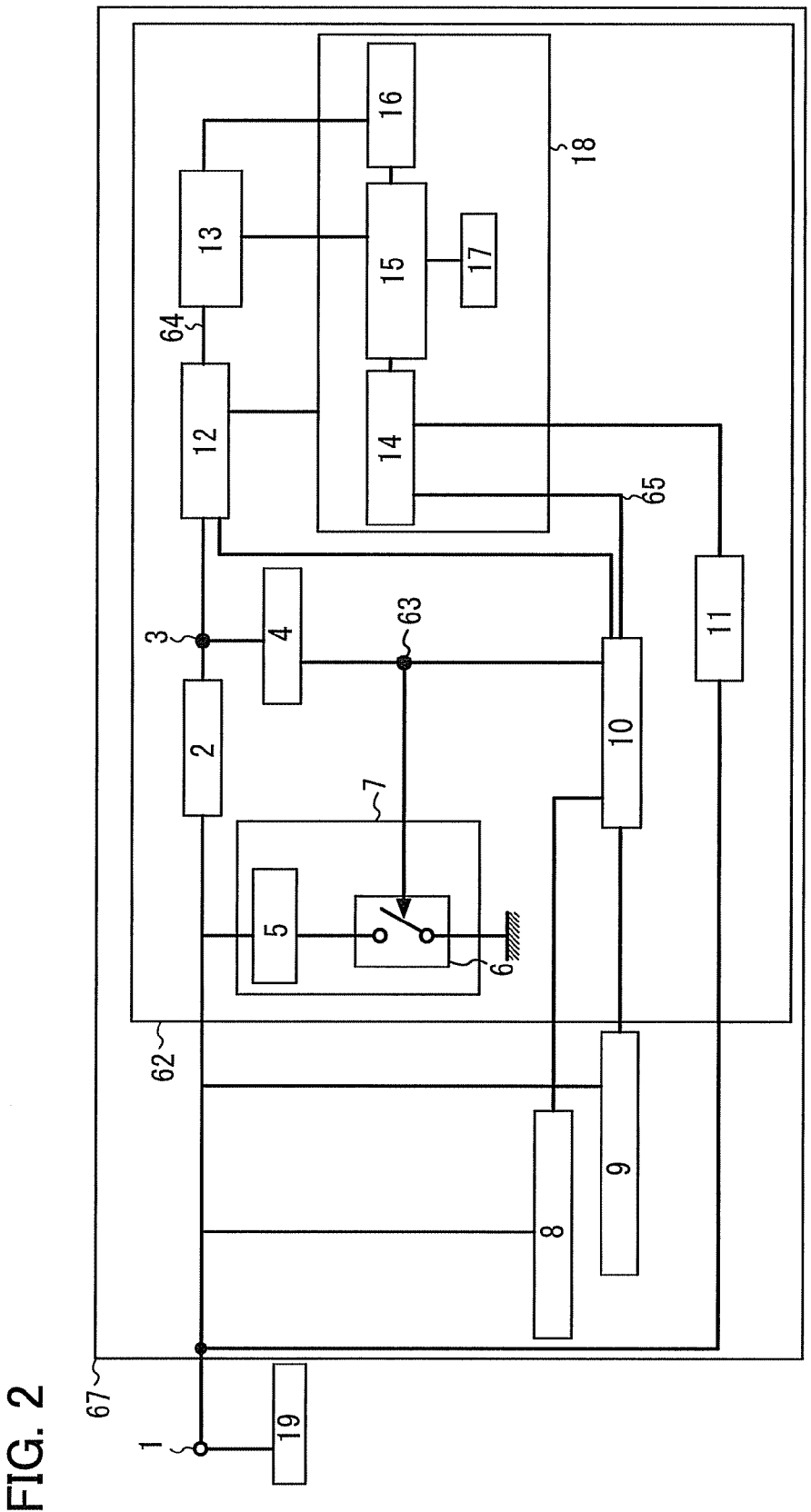
FIG. 2 is a diagram illustrating a semiconductor device according to an embodiment of the present invention.

As illustrated in FIG. 2, the semiconductor device in Embodiment 2 includes an antenna 19 and a chip 67. The chip 67 includes the rectifier circuit 2, the detection circuit 4, the protection circuit 7 including the passive element 5 and the switching element 6, the first modulation circuit 8 to which an encoded signal is input when the protection circuit 7 does not operate and which operates in accordance with the signal, the second modulation circuit 9 to which an encoded signal is input when the protection circuit 7 operates and which operates in accordance with the signal, the modulation selecting circuit 10 which selects a modulation circuit to be used in accordance with output voltage of the detection circuit, the demodulation circuit 11 which digitizes a signal received from the antenna 19, the constant voltage circuit 12 which makes output voltage of the rectifier circuit 2 constant, the clock generation circuit 13, an encoding circuit 14, a controller circuit 15, a decision circuit 16 and a memory 17. Note that the protection circuit 7 includes the passive element 5 and the switching element 6. Further, a circuit including the encoding circuit 14, the controller circuit 15, the decision circuit 16, and the memory 17 is called a logic circuit 18. Constant voltage is supplied from the constant voltage circuit 12 to the logic circuit 18.

The semiconductor device described in Embodiment 2 may be utilized as a wireless tag.

Figure 4:
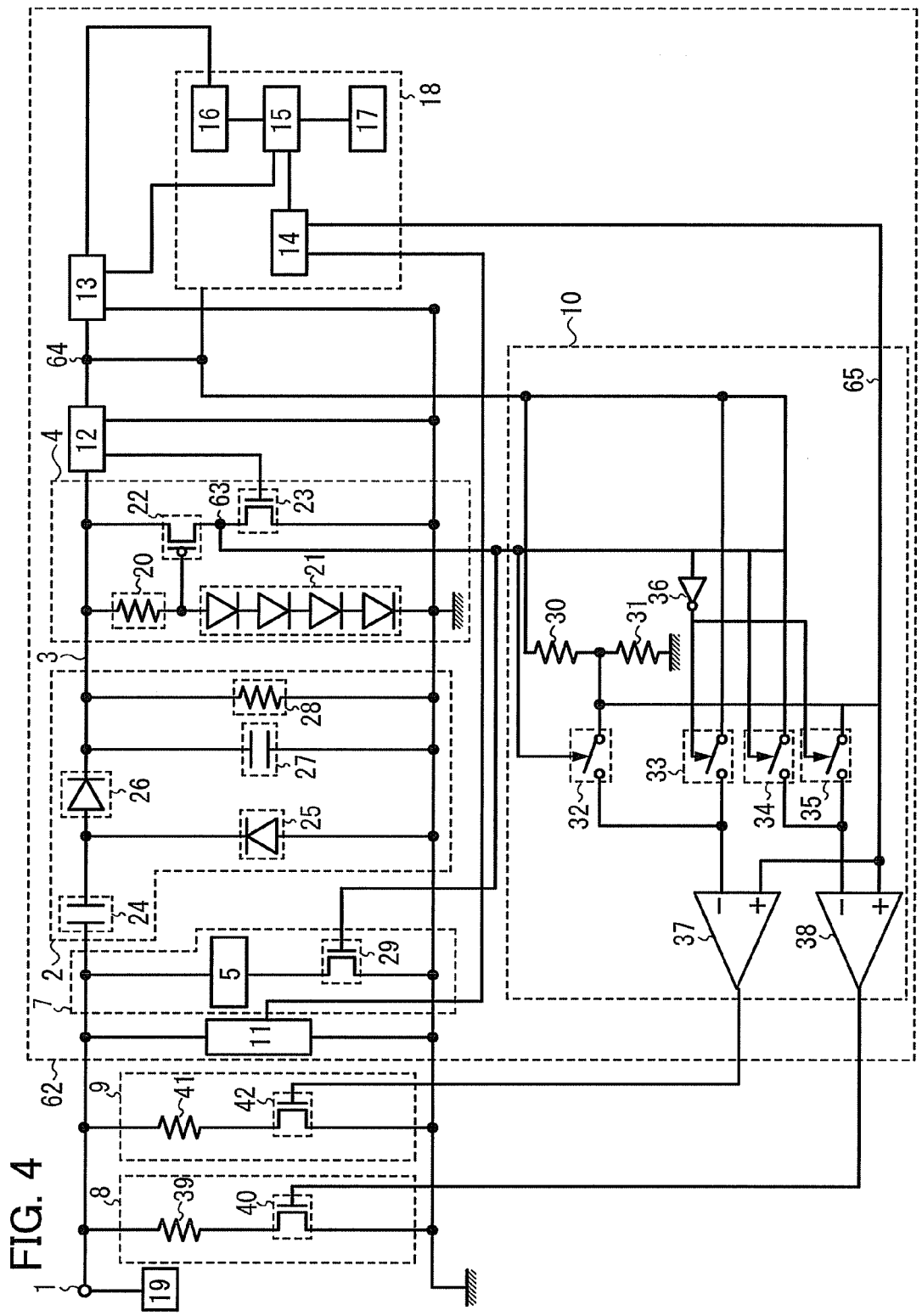
FIG. 4 is a diagram illustrating a semiconductor device according to an embodiment of the present invention.

A more specific configuration of part of the circuits in FIG. 2 is illustrated in FIG. 4.

The embodiment illustrated in FIG. 4 is the same as that illustrated in FIG. 2. The detection circuit 4 includes the four-stage diode 21, the resistor 20, the p-channel transistor 22, and the n-channel transistor 23. The rectifier circuit 2 includes the capacitor 24, the diode 25, the diode 26, the capacitor 27, and the resistor 28. There is no particular limitation on the n-channel transistor 29 which is a switching element as long as it controls electrical connection between the antenna terminal 1 and the passive element 5. For description of operation in Embodiment 2, the switching element is formed using an n-channel transistor in FIG. 4.

Next, operation of a wireless tag from receiving an instruction wirelessly from a reader/writer to responding to the reader/writer wirelessly is described with reference to FIG. 4.

A carrier wave and an amplitude modification wave are transmitted from the reader/writer. The carrier wave refers to a signal including information which is transmitted as an electrical wave or an electromagnetic wave in communication and the amplitude modification wave refers to a signal in which the carrier wave is modulated in amplitude.

The carrier wave is used for power supply voltage to make the wireless tag function. The amplitude modulation wave is used for power supply voltage to make the wireless tag function, and is to be analyzed in the logic circuit 18 after decoding an analog signal into a digital signal in the demodulation circuit 11.

Specifically, when the carrier wave is transmitted from the reader/writer, the antenna 19 receives electric power, the alternating-current voltage output from the antenna terminal 1 is converted into the direct-current voltage in the rectifier circuit 2, and the direct-current voltage is supplied to the constant voltage circuit 12. Then, the constant voltage circuit 12 generates power supply voltage for the clock generation circuit 13 and the logic circuit 18. In this stage, an instruction is not transmitted from the reader/writer, so that the tag does not send a response signal.

When the amplitude modulation wave is transmitted from the reader/writer, the antenna 19 receives electric power, the alternating-current voltage output from the antenna terminal 1 is converted into the direct-current voltage in the rectifier circuit 2, and the direct-current voltage is supplied to the constant voltage circuit 12. Then, the constant voltage circuit 12 generates power supply voltage for the clock generation circuit 13 and the logic circuit 18. The amplitude modulation wave transmitted from the reader/writer is an analog signal and is digitized in the demodulation circuit 11. The digitized data is judged whether it has been received normally in the decision circuit 16, and data which has been stored in the memory 17 is extracted by the controller circuit 15. Then, a response signal of the tag is encoded in the encoding circuit 14. Here, a modulation signal, which is the encoded signal, is transmitted to the first modulation circuit 8 or the second modulation circuit 9, whereby the tag performs load modulation and information of the tag is transmitted to the reader/writer with the carrier waves having different magnitudes of electric power. Thus, the reader/writer recognizes the order of the magnitudes of the electric power of the carrier waves as information sent from the tag.

Next, operation of the detection circuit 4 shown in FIG. 4 is described. When output voltage from the rectifier circuit 2 is low and the four-stage diode 21 is not in a conductive state, the n-channel transistor 23 is in a conductive state by Vbias, which is output from a reference circuit in the constant voltage circuit 12 and applied to a gate electrode of the n-channel transistor 23, whereby gate voltage of the p-channel transistor 22 becomes close to a potential of the output terminal 3 of the rectifier circuit and the p-channel transistor 22 becomes nonconductive since gate-source voltage thereof is higher than the threshold voltage. Therefore, the potential of the output terminal 63 of the detection circuit becomes a GND potential. In this case, gate-source voltage of the n-channel transistor 29 is lower than the threshold voltage. Accordingly, the n-channel transistor 29 becomes non-conductive, whereby the protection circuit 7 does not operate. When the output voltage from the rectifier circuit 2 becomes high and the four-stage diode 21 becomes conductive, current begins to flow to the resistor 20 and a voltage drop occurs. A generated potential difference between the voltage of the output terminal 3 of the rectifier circuit and the voltage drop becomes smaller than the threshold voltage of the p-channel transistor 22, so that the p-channel transistor becomes conductive, whereby the potential of the output terminal 63 of the detection circuit begins to increase. When gate-source voltage of the n-channel transistor 29 becomes higher than the threshold voltage, the n-channel transistor 29 becomes conductive and the protection circuit 7 operates.

In addition, when the output voltage of the rectifier circuit 2 becomes higher, voltage much lower than the threshold voltage is applied between the gate and the source of the p-channel transistor 22. In contrast, since a constant voltage VDD, which is an output of the constant voltage circuit 12, is applied to the gate terminal of the n-channel transistor 23, the resistance of the n-channel transistor 23 becomes much larger than that of the p-channel transistor 22. Then, the potential of the output terminal 63 of the detection circuit becomes closer to that of the output terminal 3 of the rectifier circuit. Also in this case, the n-channel transistor is conductive, whereby the protection circuit 7 operates.

The resistor 20 and the four-stage diode 21 in the above-described detection circuit 4 are described. Output voltage of the rectifier circuit, at which current begins to flow to the four-stage diode 21, is determined by the number of diodes connected in series and a threshold value of the diode. A voltage division ratio between the four-stage diode 21 and the resistor 20 is determined by a resistance value of the resistor 20. That is, operation start voltage (Vx) of the protection circuit 7 is determined by the number of diodes connected in series, the threshold value of the diode, and the resistance value of the resistor 20.

The four-stage diode 21 in the detection circuit 4 described above is not limited to a structure in which the four diodes are connected in series. The number of connected diodes may be set as appropriate depending on application.

Next, an operation principle of the modulation selecting circuit 10 is described. In the modulation selecting circuit 10, a resistance value of the first resistor 30 is defined as R1, a resistance value of the second resistor 31 is defined as R2, and a constant power supply voltage value is defined as VDD. When the protection circuit 7 does not operate, a potential of the output terminal 63 of the detection circuit is at a low level and the switch 33 and the switch 35 become conductive; therefore, VDD voltage is supplied to the comparator 37 and voltage of R2/(R1+R2)·VDD is supplied to the comparator 38. In this state, if a modulation signal is not input to the comparator 37 and the comparator 38, the comparator 37 and the comparator 38 do not output a modulation signal to the modulation circuit; on the other hand, if a modulation signal is input to the comparator 37 and the comparator 38, the comparator 37 does not output a modulation signal to the second modulation circuit 9 whereas the comparator 38 outputs a modulation signal to the first modulation circuit 8. As a result, load modulation is performed using the first modulation circuit 8. When the protection circuit 7 operates, a potential of the output terminal 63 of the detection circuit is at a high level and the switch 32 and the switch 34 become conductive; therefore, R2/(R1+R2)·VDD voltage is supplied to the comparator 37 and VDD voltage is supplied to the comparator 38. In this state, if a modulation signal is not input to the comparator 37 and the comparator 38, the comparator 37 and the comparator 38 do not output a modulation signal to the modulation circuit; on the other hand, if a modulation signal is input to the comparator 37 and the comparator 38, the comparator 38 does not output a modulation signal to the first modulation circuit 8 whereas the comparator 37 outputs a modulation signal to the second modulation circuit 9. As a result, load modulation is performed using the second modulation circuit 9.

The first modulation circuit 8 has a structure illustrated in FIG. 7A and has a function of controlling ON/OFF of the n-channel transistor using a modulation signal input from the logic circuit 18 through the comparator 38. The first modulation circuit 8 may be formed using, for example, the resistor 39 and the n-channel transistor 40. As the transistor, for example, a thin film transistor (TFT) can be used. Note that as illustrated in FIG. 7B, the modulation circuit without a resistor may perform load modulation using only the n-channel transistor 44. Alternatively, as illustrated in FIG. 7C, the modulation circuit may be formed using the capacitor 66 and the n-channel transistor 44.

The second modulation circuit 9 has a structure illustrated in FIG. 7A and has a function of controlling ON/OFF of the n-channel transistor using a modulation signal input from the logic circuit 18 through the comparator 37. The second modulation circuit 9 may be formed using, for example, the resistor 39 and the n-channel transistor 40. As the transistor, for example, a thin film transistor (TFT) can be used. Note that as illustrated in FIG. 7B, the modulation circuit without a resistor may perform load modulation using only the n-channel transistor 44. Alternatively, as illustrated in FIG. 7C, the modulation circuit may be formed using the capacitor 66 and the n-channel transistor 44.

The first modulation circuit 8 and the second modulation circuit 9 may have the same configuration or different configurations.

Next, operation of the second modulation circuit 9 which includes the resistor 41 and the n-channel transistor 42 shown in FIG. 4 is described. A modulation signal is input to a gate of the n-channel transistor 42 from an output terminal of the modulation selecting circuit. Depending on the input level, the n-channel transistor 42 is in a conductive state or a non-conductive state. When the n-channel transistor 42 is in a non-conductive state, current does not flow to the resistor 41 and the n-channel transistor 42, so that current flowing from the antenna terminal 1 flows to the first modulation circuit 8 and the load 62. When the n-channel transistor 42 is in a conductive state, current flowing from the antenna terminal 1 is divided to flow to the second modulation circuit 9 and the load 62. It is defined that current flowing to the second modulation circuit 9 is I2 and current flowing to the load 62 is Ir. When I2 is larger than Ir, the amount of change in impedance of the chip 67 from the antenna terminal 1 is larger.

A parameter which determines amplitude of a response signal is described with reference to FIG. 7A. A drain-source current Id in a saturation region of the n-channel transistor in FIG. 7A can be obtained by Formula 1 described in Embodiment 1. In order to increase the amplitude of the response signal, a resistance value of the modulation circuit is determined to be small so that current flowing to the modulation circuit is increased. In addition, each parameter which determines drain current of the n-channel transistor may be determined so that the drain current is increased.

The magnitude of the amplitude of the response signal when the protection circuit 7 does not operate is determined by a ratio between current flowing to the first modulation circuit 8 and current flowing to the load 62 when the modulation signal is at a high level. Further, the magnitude of the amplitude of the response signal when the protection circuit 7 operates is determined by a ratio between current flowing to the second modulation circuit 9 and current flowing to the load 62. In order to increase the magnitude of a response waveform, a ratio between an impedance Z1 of the modulation circuit and an impedance Z2 of the load when the modulation signal is at a high level is determined so that a large amount of current flows to the modulation circuit. Note that the impedance Z2 of the load differs in the cases where the protection circuit 7 operates and where the protection circuit 7 does not operate. Therefore, the first modulation circuit 8 and the second modulation circuit 9 are needed to be designed in consideration thereof.

A description is made on, for example, a method for setting parameters of the resistor 39 and the n-channel transistor 40 which are included in the first modulation circuit 8 and the resistor 41 and the n-channel transistor 42 which are included in the second modulation circuit 9 by employing the first modulation circuit 8 including the resistor 39 and the n-channel transistor 40 and the second modulation circuit 9 including the resistor 41 and the n-channel transistor 42, which are shown in FIG. 4. For example, a resistance value of the resistor 39 of the first modulation circuit 8 is defined as R3 and a resistance value of the resistor 41 of the second modulation circuit 9 is defined as R4. The resistance values are determined so as to satisfy R3<R4, whereby the amplitude of a response signal when the protection circuit operates can be increased. Further, current which flows to the n-channel transistor 40 included in the first modulation circuit 8 is defined as ID1 and current which flows to the n-channel transistor 42 included in the second modulation circuit 9 is defined as ID2. A parameter K' which determines the drain current of the n-channel transistor, a channel length modulation coefficient λ, a channel width W, a channel length L, a gate-source voltage Vgs, the threshold voltage Vt, and a drain-source voltage Vds are determined to satisfy ID2>ID1, so that the amplitude of a response signal when the protection circuit 7 operates can be increased. Note that when the current ID2 which flows to the second modulation circuit 9 is increased too much so as to increase the amplitude of a response signal, the current which flows to the load 62 decreases, whereby current necessary for operating the logic circuit 18 is not supplied. In this case, the logic circuit 18 does not operate; therefore, it is necessary to be careful.

Further, output voltage from the rectifier circuit 2 is adjusted to be constant voltage by the constant voltage circuit 12 and then it is output to the clock generation circuit 13 and the logic circuit 18. The constant voltage circuit 12 includes a reference circuit and a differential amplifier circuit. Voltage output from the reference circuit is compared by the differential amplifier circuit with the output voltage of the rectifier circuit which is input to the constant voltage circuit 12, whereby the constant voltage is generated.

Figure 8B:
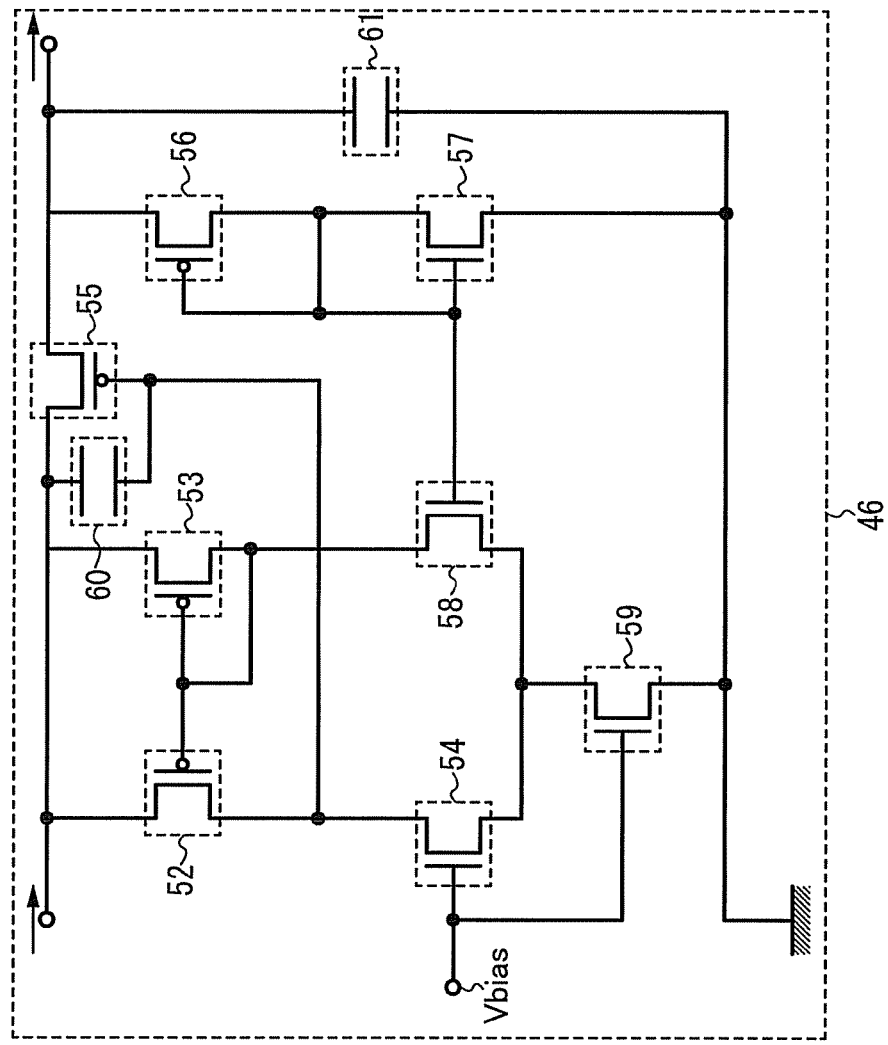
FIGS. 8A and 8B are diagrams each illustrating a semiconductor device according to an embodiment of the present invention.
Figure 8A:
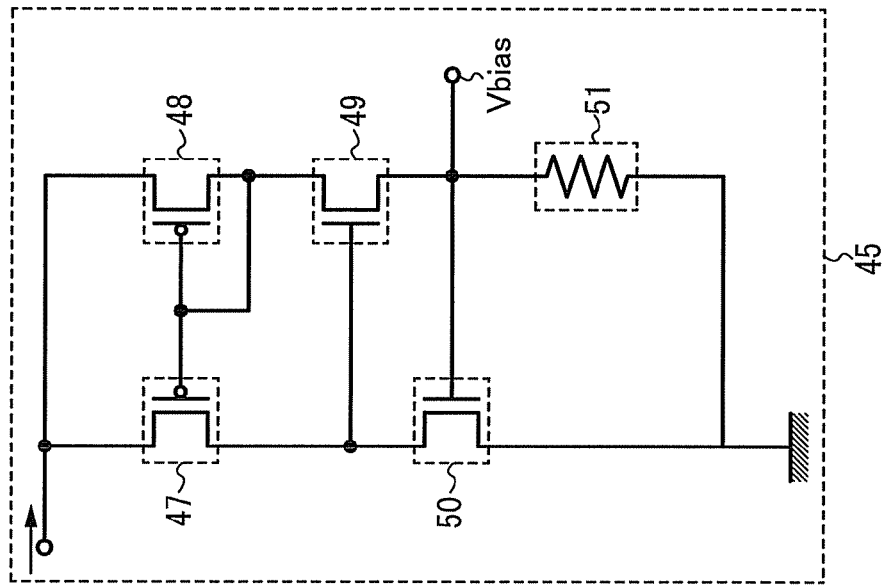

The reference circuit and the differential amplifier circuit which are included in the constant voltage circuit 12 are illustrated in FIGS. 8A and 8B, respectively. As illustrated in FIG. 8A, the reference circuit 45 includes a current mirror circuit which is formed using two p-channel transistors 47 and 48 of the same size, n-channel transistors 49 and 50 of the same size, and a resistor 51. The differential amplifier circuit 46 includes, as illustrated in FIG. 8B, a current mirror circuit which is formed using two p-channel transistors 52 and 53 of the same size, n-channel transistors 54 and 58 of the same size, a p-channel transistor 55, a p-channel transistor 56, an n-channel transistor 57, an n-channel transistor 59, a capacitor 60, and a capacitor 61. In order that the reference circuit 45 and the differential amplitude circuit 46 are in a saturation region when the output voltage of the rectifier circuit is the same value, the p-channel transistors 47, 48, 52, and 53 have the same size, whereas the n-channel transistors 49, 50, 54, and 58 have the same size.

An operation principle of the reference circuit 45 is described. Direct-current voltage is applied to the output terminal 3 of the rectifier circuit. When the gate-source potential of each the p-channel transistor 47 and the p-channel transistor 48 is smaller than or equal to the threshold voltage, the p-channel transistor 47 and 48 are turned on. After that, a gate potential of the n-channel transistor 49 begins to increase. When the gate-source voltage of the n-channel transistor 49 is higher than or equal to the threshold voltage, the n-channel transistor 49 is turned on. Then, current flows to the resistor 51 and a voltage drop occurs, which is to be gate-source voltage of the n-channel transistor 50. As current which flows to the resistor 51 is increased, a potential difference generated in the resistor 51 due to the voltage drop is increased; therefore, the gate potential of the n-channel transistor 50 begins to increase, and when the gate-source voltage thereof becomes higher than or equal to the threshold value, the n-channel transistor 50 is turned on.

When the output voltage of the rectifier circuit is applied so that the p-channel transistors 47 and 48 and the n-channel transistors 49 and 50 operate in a non-saturation region, Vbias fluctuates with changes in the output voltage of the rectifier circuit.

When the output voltage of the rectifier circuit is applied so that the p-channel transistors 47 and 48 and the n-channel transistors 49 and 50 operate in a saturation region, a potential difference generated in the resistor 51 due to the voltage drop becomes constant regardless of changes in the output voltage of the rectifier circuit; therefore, Vbias becomes constant.

Accordingly, it is preferable to operate the p-channel transistors 47 and 48 and the n-channel transistors 49 and 50 in a saturation region when Vbias of the reference circuit 45 is set to be constant to changes in the output voltage of the rectifier circuit.

Next, an operation principle of the differential amplifier circuit 46 is described. The p-channel transistor 52 and the p-channel transistor 53 are turned on when the gate-source voltages thereof become lower than or equal to the threshold voltage. When the p-channel transistor 52 is turned on, the n-channel transistor 54 is turned on if Vbias which is applied between a gate and a source of the n-channel transistor 54 is higher than or equal to the threshold voltage, whereby a potential difference is generated between a source and a drain of the p-channel transistor 52.

In addition, when the source-drain voltage of the p-channel transistor 52 is higher than or equal to the threshold value of the gate-source voltage of the p-channel transistor 55, the p-channel transistor 55 is turned on, and voltage occurs in a constant voltage output terminal. A drain and a gate of the p-channel transistor 56 are connected to each other and a drain and a gate of the n-channel transistor 57 are connected to each other, each of which is a diode connection; therefore, the output voltage of the constant voltage circuit is divided in accordance with a resistance ratio between the source-drain resistance of the p-channel transistor 56 and the drain-source resistance of the n-channel transistor 57, and then the divided voltage (the source-drain voltage of the n-channel transistor 57) is applied to the gate of the n-channel transistor 58. In addition, since the differential amplifier circuit 46 operates so that gate nodes of the p-channel transistor 56 and the n-channel transistor 57 have the same voltage as the Vbias supplied from the reference circuit, the output voltage value of the constant voltage circuit is determined by Vbias generated between the both ends of the resistor 51 in the reference circuit 45 and a resistance ratio between the source-drain resistance of the p-channel transistor 56 and the drain-source resistance of the n-channel transistor 57.

When the transistors included in the reference circuit 45 operate in a non-saturation region, source-drain current flowing to the p-channel transistor 47 and the p-channel transistor 48, which are included in the current mirror circuit, fluctuates with changes in the output voltage of the rectifier circuit, whereby current flowing to the resistor 51 also fluctuates and the output voltage Vbias of the reference circuit fluctuates. Since the n-channel transistor 58 operates so that its voltage value becomes the same voltage value as Vbias, the gate voltage of the n-channel transistor 58 fluctuates with changes in the output voltage of the rectifier circuit; therefore, the output voltage of the constant voltage circuit also fluctuates and the constant voltage is not obtained. On the other hand, when the transistors included in the reference circuit 45 operate in a saturation region, source-drain current flowing to the p-channel transistor 47 and the p-channel transistor 48, which are included in the current mirror circuit, becomes constant to change in the output voltage of the rectifier circuit, whereby current flowing to the resistor 51 becomes constant and the output voltage Vbias of the reference circuit becomes constant. Since the n-channel transistor 58 operates so that its gate voltage becomes the same voltage value as Vbias, the gate voltage of the n-channel transistor 58 becomes constant to changes in the output voltage of the rectifier circuit; therefore, the output voltage of the constant voltage circuit also becomes constant.

By the above-described operation of the reference circuit 45 and the differential amplifier circuit 46, although the output voltage of the rectifier circuit which is input to the constant voltage circuit 12 fluctuates, the output voltage of the constant voltage circuit 12 is constant as long as the transistors included in the reference circuit 45 operate in a saturation region.

As the memory 17, there are an EEPROM and an FeRAM which can store data for a long period of time without any electric power being supplied. Considering the writing speed, the writing voltage, the writing energy, and the like, an FeRAM is more practical.

As each of the four-stage diode 21, the diode 25, and the diode 26, an n-channel transistor whose gate node and drain node are electrically connected to each other may also be used instead of a diode element.

The passive element 5 can be formed using a resistor or a capacitor.

Although the protection circuit 7 described above has a configuration including the passive element 5 and the switching element 6, a configuration including only the switching element 6 may be employed.

A shape of the antenna 19 may be selected depending on a communication system. The wireless tag described in Embodiment 2 can perform communication by an electromagnetic induction method or a radio wave method.

It is an object of the above-described load modulation to encrypt data by changing the reflectance or phase of data transmitted from the antenna depending on the terminal or connection state of the antenna. The load modulation includes resistive load modulation and capacitive load modulation in its category.

The above-described wireless tag is used in an ASK modulation system, an FSK modulation system, and a PSK modulation system. The ASK modulation system is a system in which the amplitude of a signal to be transmitted is changed. The FSK modulation system is a system in which the frequency of a signal to be transmitted is changed. The PSK modulation system is a system in which the phase of a signal to be transmitted is changed.

The semiconductor device of Embodiment 2 is provided with the first modulation circuit 8, the second modulation circuit 9, and the modulation selecting circuit 10 at positions illustrated in FIG. 4, whereby the modulation selecting circuit 10 determines which modulation circuit operates depending on a state whether the protection circuit 7 operates or not. Thus, the amplitude of the response signal of the RF tag is increased, and communication defect of the conventional protection circuit 7 at the operation can be improved.

Embodiment 2 can be implemented in combination with the structure of any semiconductor device described in any other embodiments in this specification.

Embodiment 3

In Embodiment 3, a method for manufacturing a semiconductor device having higher reliability with high yield is described with reference to FIGS. 9A to 9D. In Embodiment 3, a CMOS (complementary metal oxide semiconductor) is described as an example of the semiconductor device.

Figure 9A:
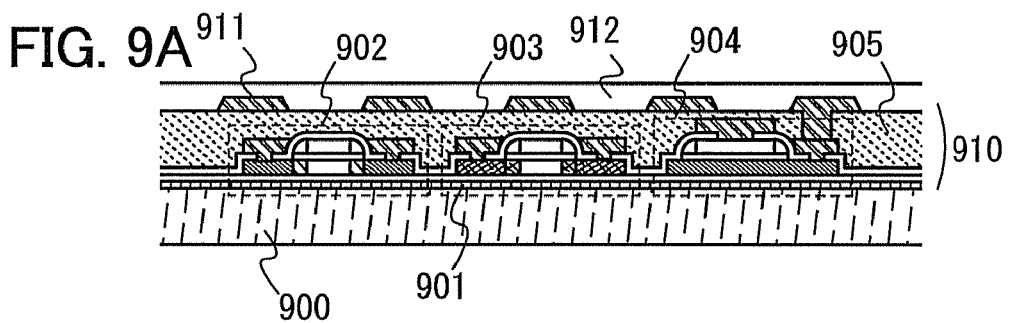
FIGS. 9A to 9D are views illustrating a method for manufacturing a semiconductor device according to an embodiment of the present invention.
Figure 9B:
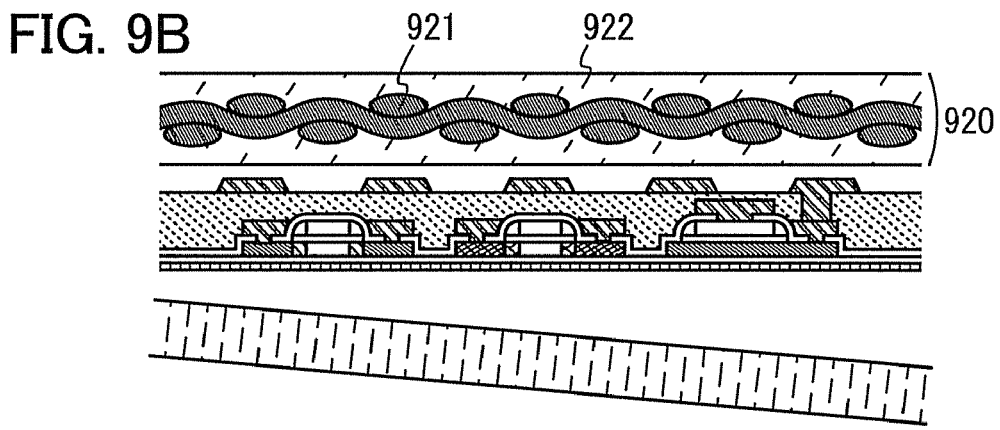

Transistors 902 and 903, a capacitor 904, and an insulating layer 905 are formed over a substrate 900 with a separation layer 901 interposed therebetween, and thus a semiconductor integrated circuit 910 is formed (see FIG. 9A).

The transistors 902 and 903 are thin film transistors. Each transistor includes a source region, a drain region, low-concentration impurity regions, a channel formation region, a gate insulating layer, a gate electrode, a source electrode, and a drain electrode. The source region and the drain region are respectively in contact with and electrically connected to a wiring serving as the source electrode and a wiring serving as the drain electrode.

The transistor 902 is an n-channel transistor, which includes an impurity element imparting n-type conductivity (for example, phosphorus (P) or arsenic (As)) in the source region, the drain region, and the low-concentration impurity regions. The transistor 903 is a p-channel transistor, which includes an impurity element imparting p-type conductivity (for example, boron (B), aluminum (Al), or gallium (Ga)) in the source region, the drain region, and the low-concentration impurity regions.

The capacitor 904 is formed in a process similar to the transistors 902 and 903, and one electrode of the capacitor 904 is formed using a semiconductor layer while the other is formed using a layer which is simultaneously formed with a gate electrode. In this case, in order to efficiently secure the capacitance value, the semiconductor layer which forms the capacitor 904 may be added with an impurity element before a gate electrode layer is formed. Through this process, the semiconductor layer formed below the gate electrode layer is also added with the impurity element, whereby the capacitor 904 can efficiently function.

Next, an antenna 911 is formed using a conductive film over the insulating layer 905, and a protection film 912 is formed over the antenna 911. The antenna 911 is electrically connected to the semiconductor integrated circuit. In FIG. 9A, the antenna 911 is electrically connected to the one electrode of the capacitor 904.

Then, an insulator 920 is formed over the protection film 912. As the insulator 920, for example, a structure body in which a fibrous body 921 is impregnated with an organic resin 922 may be used.

After the protection film 912 and the insulator 920 are bonded to each other, the semiconductor integrated circuit 910, the antenna 911, and the protection film 912 are separated from the substrate 900 along the separation layer 901 which serves as an interface. Therefore, the semiconductor integrated circuit 910, the antenna 911, and the protection film 912 are provided on the insulator 920 side (see FIG. 9B).

The protection film 912 and the insulator 920 may be bonded to each other using an adhesive, though the adhesive is not shown. Alternatively, the protection film 912 and the insulator 920 may be bonded by pressure bonding or heating and pressure bonding.

Figure 9C:
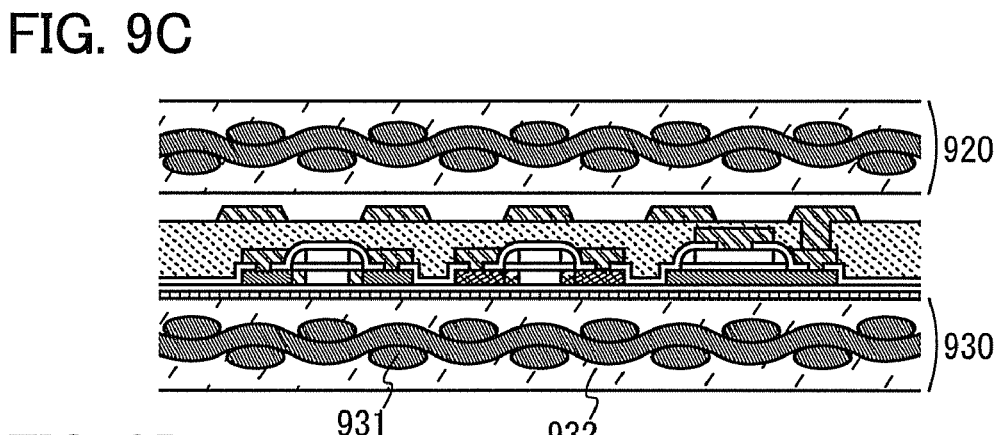
Figure 9D:
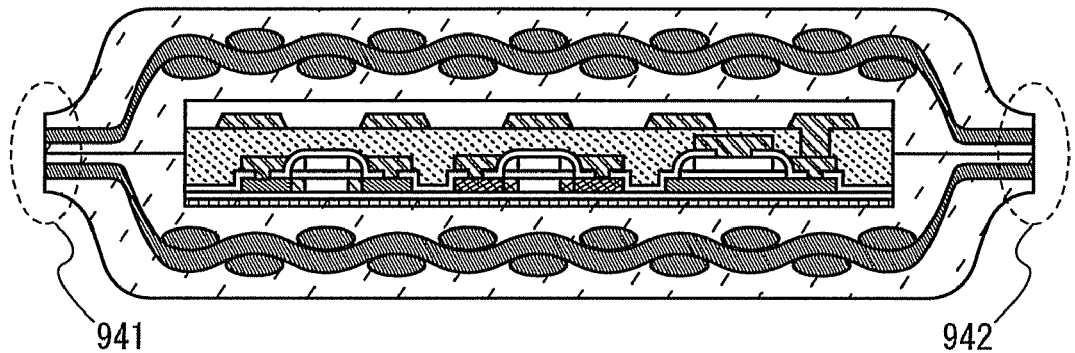
Figure 10A:
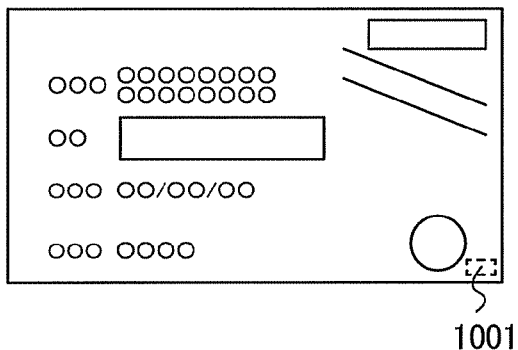
FIGS. 10A to 10G are views illustrating examples each of which includes a semiconductor device according to an embodiment mode of the present invention.
Figure 10B:
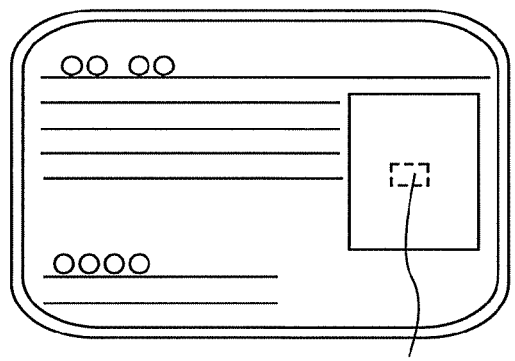
Figure 10C:
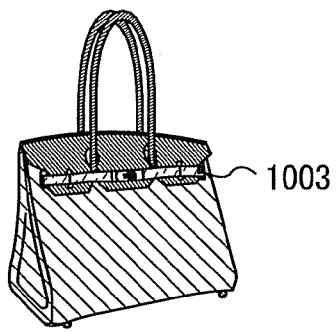
Figure 10D:
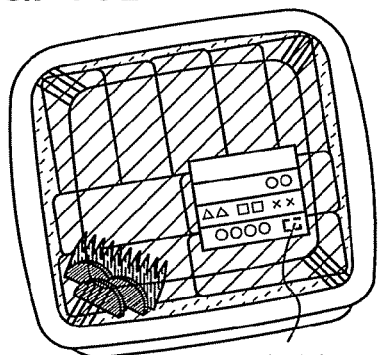
Figure 10E:
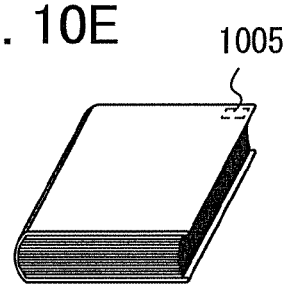
Figure 10F:
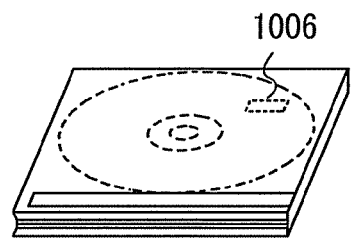
Figure 10G:
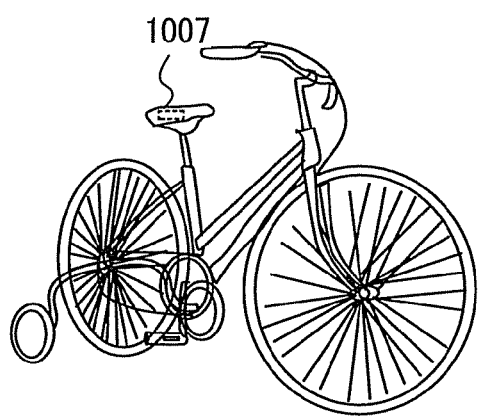

Then, an insulator 930 is bonded to the separation surface side of the semiconductor integrated circuit 910 on which the semiconductor integrated circuit 910 is exposed through the separation layer 901, whereby the semiconductor integrated circuit 910, the antenna 911, and the protection film 912 are sandwiched between the insulator 920 and the insulator 930 (see FIG. 9C).

In a manner similar to the insulator 920, the insulator 930 may be formed of a structure body in which, for example, a fibrous body 931 is impregnated with an organic resin 932.

Although not illustrated, the insulator 920 and the insulator 930 have a plurality of structure bodies formed of a plurality of the semiconductor integrated circuits 910, the antennas 911, and the protection layers 912 sandwiched, which are aligned in a plane direction. By dividing the structure bodies into individual pieces, a semiconductor integrated circuit chip having a structure in which the semiconductor integrated circuit 910, the antenna 911, and the protection film 912 are sandwiched between the insulator 920 and the insulator 930 is manufactured. There is no particular limitation on a division means as long as physical division is possible; however, as a preferable example, dividing is performed by laser beam irradiation along a division line in Embodiment 3.

By dividing by laser beam irradiation, the insulator 920 and the insulator 930 are melted and welded to each other at divided surfaces 941 and 942 of the semiconductor integrated circuit chip, whereby each semiconductor integrated circuit chip has a structure in which the semiconductor integrated circuit 910, the antenna 911, and the protection film 912 are entirely sealed with the insulator 920 and the insulator 930.

Although not illustrated in particular here, an insulator may be further provided outside or inside the insulator 920 and the insulator 930 so as to seal the semiconductor integrated circuit 910, the antenna 911, and the protection film 912 better.

Thus, the insulators are provided so as to sandwich the semiconductor integrated circuit, adverse effects such as damages and characteristic defects of the semiconductor integrated circuit due to external stress and stress can be prevented in a manufacturing process. Accordingly, a semiconductor device having high reliability can be manufactured with high yield.

The semiconductor device manufactured in Embodiment 3 can have flexibility with the use of a flexible insulator.

The semiconductor layer included in each of the transistors 902 and 903 and the capacitor 904 can be formed using any of the following materials: an amorphous semiconductor formed by a vapor-phase growth method or a sputtering method using a semiconductor material gas typified by silane or germane; a polycrystalline semiconductor formed by crystallizing the amorphous semiconductor with the use of light energy or thermal energy; a microcrystalline semiconductor (also referred to as semiamorphous or microcrystal. Hereinafter it is also referred to as "SAS"); or the like. The semiconductor layer can be formed by a sputtering method, an LPCVD method, a plasma CVD method, or the like.

The microcrystalline semiconductor film belongs to a metastable state which is intermediate between an amorphous state and a single crystal state, when Gibbs free energy is considered. That is, the microcrystalline semiconductor film is a semiconductor having a third state which is stable in terms of free energy and has a short-range order and lattice distortion. Column-like or needle-like crystals grow in a normal direction with respect to a substrate surface. The Raman spectrum of microcrystalline silicon, which is a typical example of a microcrystalline semiconductor, is shifted to a lower wavenumber side than 520 cm$^{-1}$, which represents a peak of the Raman spectrum of single-crystalline silicon. That is, the peak of the Raman spectrum of the microcrystalline silicon exists between 520 cm$^{-1}$ which represents single-crystalline silicon and 480 cm$^{-1}$ which represents amorphous silicon. The microcrystalline semiconductor film includes hydrogen or halogen of at least 1 at. % to terminate a dangling bond. Moreover, a rare gas element such as helium, argon, krypton, or neon may be included to further promote lattice distortion, so that stability is enhanced and a favorable microcrystalline semiconductor film can be obtained.

The microcrystalline semiconductor film can be formed by a high-frequency plasma CVD method with a frequency of several tens to several hundreds of megahertz or using a microwave plasma CVD apparatus with a frequency of 1 GHz or more. The microcrystalline semiconductor film can be typically formed using a dilution of silicon hydride such as $SiH_4$, or $Si_2H_6$, with hydrogen. The microcrystalline semiconductor film can be formed with a dilution of one or plural kinds of rare gas elements selected from helium, argon, krypton, or neon in addition to silicon hydride and hydrogen. In the latter case, the flow ratio of hydrogen to silicon hydride is set to be 5:1 to 200:1, preferably, 50:1 to 150:1, more preferably, 100:1. Note that $SiH_2Cl_2$, $SiHCl_3$, $SiCl_4$, $SiF_4$, or the like can be used instead of silicon hydride.

Hydrogenated amorphous silicon can be given as a typical example of an amorphous semiconductor, while polysilicon (polycrystalline silicon) or the like can be given as a typical example of a crystalline semiconductor. Polysilicon includes so-called high-temperature polysilicon formed using polysilicon which is formed at processing temperatures of greater than or equal to 800° C. as a main material, so-called low-temperature polysilicon formed using polysilicon which is formed at processing temperatures of less than or equal to 600° C. as a main material, polysilicon formed by crystallization of amorphous silicon using an element that promotes crystallization, and the like. It is needless to say that as mentioned above, a microcrystalline semiconductor or a semiconductor containing a crystal phase in part of a semiconductor layer may be used.

As a material of the semiconductor, other than an element of silicon (Si), germanium (Ge), or the like, a compound semiconductor such as GaAs, InP, SiC, ZnSe, GaN, or SiGe can be given. Alternatively, an oxide semiconductor such as zinc oxide (ZnO), tin oxide ($SnO_2$), magnesium zinc oxide, gallium oxide, or indium oxide, or an oxide semiconductor including a plurality of the above oxide semiconductors may be used. For example, an oxide semiconductor including zinc oxide, indium oxide, and gallium oxide may be used. In the case of using zinc oxide for the semiconductor layer, the gate insulating layer may be formed using $Y_2O_3$, $Al_2O_3$, $TiO_2$, or a stacked layer thereof, and for the gate electrode layer, the source electrode layer, and the drain electrode layer, ITO, Au, Ti, or the like may be used. Further, In, Ga, or the like can be added to ZnO.

In the case of using a crystalline semiconductor layer for the semiconductor layer, the crystalline semiconductor layer may be formed by any of various methods (such as a laser crystallization method, a thermal crystallization method, and a thermal crystallization method using an element promoting crystallization such as nickel). Further, a microcrystalline semiconductor, which is an SAS, can be crystallized by laser beam irradiation so as to increase its crystallinity. When the element that promotes the crystallization is not introduced, before an amorphous silicon film is irradiated with a laser beam, the amorphous silicon film is heated at 500° C. for one hour under a nitrogen atmosphere to release hydrogen contained in the amorphous silicon to reduce the concentration of hydrogen to $1 \times 10^{20}$ atoms/cm$^3$ or less. This is because the amorphous silicon film is destroyed when the amorphous silicon film containing a large amount of hydrogen is irradiated with a laser beam.

As a method for introducing a metal element into the amorphous semiconductor layer, there is no particular limitation as long as the metal element can be provided on a surface of or inside the amorphous semiconductor layer. For example, a sputtering method, a CVD method, a plasma processing method (including a plasma CVD method), an adsorption method, or a method for applying a solution of metal salt, can be used. In the above-mentioned methods, the method using a solution is convenient and has an advantage of easily adjusting the concentration of a metal element. In addition, in order to improve the wettability of the surface of the amorphous semiconductor layer and to spread an aqueous solution on the entire surface of the amorphous semiconductor layer, an oxide film is preferably formed by UV light irradiation in an oxygen atmosphere, a they mal oxidation method, treatment using ozone water containing hydroxyl radical or hydrogen peroxide, or the like.

The crystallization may be performed by adding an element which promotes crystallization (also referred to as a catalyst element or a metal element) to the amorphous semiconductor layer and performing heat treatment (at 550° C. to 750° C. for 3 minutes to 24 hours) in a crystallization step in which the amorphous semiconductor layer is crystallized to form a crystalline semiconductor layer. As the element which promotes (helps) the crystallization, one or more kinds selected from iron (Fe), nickel (Ni), cobalt (Co), ruthenium (Ru), rhodium (Rh), palladium (Pd), osmium (Os), iridium (Ir), platinum (Pt), copper (Cu), or gold (Au) can be used.

In order that the element promoting crystallization is removed from the crystalline semiconductor layer or reduced, a semiconductor layer containing an impurity element is formed in contact with the crystalline semiconductor layer and is made to function as a gettering sink. As the impurity element, an impurity element imparting n-type conductivity, an impurity element imparting p-type conductivity, or a rare gas element may be used. For example, one or more kinds selected from phosphorus (P), nitrogen (N), arsenic (As), antimony (Sb), bismuth (Bi), boron (B), helium (He), neon (Ne), argon (Ar), krypton (Kr), or xenon (Xe) can be used. The semiconductor layer containing a rare gas element is formed over the crystalline semiconductor layer containing an element which promotes crystallization, and heat treatment (at 550° C. to 750° C. for 3 minutes to 24 hours) is performed. The element which promotes crystallization in the crystalline semiconductor layer moves into the semiconductor layer containing the rare gas element, and the element which promotes crystallization in the crystalline semiconductor layer is removed or reduced. Then, the semiconductor layer containing the rare gas element, which serves as a gettering sink, is removed.

Heat treatment and laser beam irradiation may be combined to crystallize the amorphous semiconductor layer. Alternatively, only one of heat treatment and laser beam irradiation may be performed plural times without being combined.

Further, a crystalline semiconductor layer may be directly formed over a substrate by a plasma method. Alternatively, a crystalline semiconductor layer may be selectively formed over a substrate by a plasma method.

The gate insulating layer may be formed of silicon oxide or a stacked layer of silicon oxide and silicon nitride. The gate insulating layer may be formed by depositing an insulating film by a plasma CVD method or a low pressure CVD method, or may be formed by solid phase oxidation or solid phase nitridation by plasma treatment. This is because a gate insulating layer formed by oxidation or nitridation of a semiconductor layer by plasma treatment is dense, has high withstand voltage, and is excellent in reliability. For example, a surface of the semiconductor layer is oxidized or nitrided using nitrous oxide ($N_2O$) which is diluted with Ar so that flow ratio of $N_2O$ to Ar is 1:1 to 3 by application of a microwave (2.45 GHz) with power of 3 to 5 kW at a pressure of 10 to 30 Pa. By this treatment, an insulating film having a thickness of 1 nm to 10 nm (preferably 2 nm to 6 nm) is formed. Further, a silicon oxynitride film is formed by a vapor deposition method in which nitrous oxide ($N_2O$) and silane ($SiH_4$) are introduced and a microwave (2.45 GHz) with power of 3 to 5 kW is applied at a pressure of 10 to 30 Pa; accordingly, the gate insulating layer is formed. A gate insulating layer with a low interface state density and excellent withstand voltage can be formed by combination of the solid phase reaction and the reaction by a vapor deposition method.

As the gate insulating layer, a high dielectric constant material such as zirconium dioxide, hafnium oxide, titanium dioxide, tantalum pentoxide, or the like may be used. When the high dielectric constant material is used for the gate insulating layer, gate leakage current can be reduced.

The gate electrode layer can be formed by a CVD method, a sputtering method, a droplet discharge method, or the like. The gate electrode layer may be formed of an element selected from Ag, Au, Cu, Ni, Pt, Pd, Ir, Rh, W, Al, Ta, Mo, Cd, Zn, Fe, Ti, Si, Ge, Zr, or Ba, or an alloy material or a compound material containing any of the above elements as its main component. Alternatively, a semiconductor film typified by a polycrystalline silicon film doped with an impurity element such as phosphorus, or an AgPdCu alloy may be used. Further, either a single-layer structure or a multi-layer structure may be employed. For example, a two-layer structure of a tungsten nitride film and a molybdenum film may be employed, or a three-layer structure in which a tungsten film with a thickness of 50 nm, an alloy film of aluminum and silicon (Al—Si) with a thickness of 500 nm, and a titanium nitride film with a thickness of 30 nm are stacked in this order may be employed. In the case of employing a three-layer structure, tungsten nitride may be used instead of tungsten for a first conductive film, an alloy film of aluminum and titanium (Al—Ti) may be used instead of the alloy film of aluminum and silicon (Al—Si) for a second conductive film, and a titanium film may be used instead of the titanium nitride film for a third conductive film.

A light-transmitting material having a transmitting property to visible light can be also used for the gate electrode layer. As the light-transmitting conductive material, indium tin oxide (ITO), indium tin oxide containing silicon oxide, organic indium, organic tin, zinc oxide, or the like can be used. In addition, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like may be used.

In the case where etching is required to form the gate electrode layer, a mask is formed and dry etching or wet etching may be performed. The electrode layer can be etched to have a tapered shape by an ICP (inductively coupled plasma) etching method in an appropriately controlled condition (the amount of electric power applied to a coiled electrode, the amount of electric power applied to an electrode on a substrate side, the temperature of the electrode on the substrate side, or the like). Note that a chlorine-based gas typified by $Cl_2$, $BCl_3$, $SiCl_4$, and $CCl_4$; a fluorine-based gas typified by $CF_4$, $SF_6$, and $NF_3$; or $O_2$ can be appropriately used for an etching gas.

Although a transistor having a single gate structure is described as an example in Embodiment 3, a transistor having a multi-gate structure such as a double-gate structure may be also used. In the latter case, gate electrode layers may be provided on an upper side and a lower side of the semiconductor layer. Alternatively, a plurality of gate electrode layers may be provided on only one side (an upper side or a lower side) of the semiconductor layer.

Alternatively, silicide may be provided over the source and drain regions of the transistor. The silicide is formed by forming a conductive film on the source region and the drain region of the semiconductor layer and reacting silicon in the source region and drain region of the semiconductor layer with the conductive film by heat treatment using a furnace or heat treatment such as an RTA method such as a GRTA (gas rapid thermal anneal) method or an LRTA (lamp rapid thermal anneal) method. Alternatively, the silicide may be formed by laser irradiation or light irradiation with a lamp. As a material of the conductive film used for the silicide, any of the following can be used: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like.

A wiring layer functioning as a source electrode layer or a drain electrode layer can be formed in such a way that a conductive film is formed by a PVD method, a CVD method, an evaporation method, or the like, and then etched into a desired shape. Alternatively, the wiring layer can be formed selectively at a predetermined place by a printing method, an electroplating method, or the like. Further, a reflow method or a damascene method may be used as well. As a material of the wiring layer, metal such as Ag, Au, Cu, Ni, Pt, Pd, Ir, Rh, W, Al, Ta, Mo, Cd, Zn, Fe, Ti, Zr, or Bo, a semiconductor such as Si or Ge, or an alloy or a nitride thereof can be used. Further, a light-transmitting material can be also used.

As the light-transmitting conductive material, indium tin oxide (ITO), indium tin oxide containing silicon oxide, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like can be used.

As a semiconductor element, not to mention a field-effect transistor, a memory element including a semiconductor layer or the like can be applied to the semiconductor device according to an embodiment of the present invention; accordingly, a semiconductor device which can satisfy functions required for variety of applications can be manufactured and provided. Embodiment 3 can be implemented in combination with the structure of any semiconductor device described in any other embodiments in this specification.

Embodiment 4

According to an embodiment of the present invention, a semiconductor device functioning as a wireless tag (hereinafter, also referred to as a wireless processor, or a wireless memory) can be manufactured. An applicable range of a semiconductor device according to an embodiment of the present invention is wide, and the semiconductor device can be applied to any product which clarifies information of an object, such as the history thereof, without contact and is useful for production, management, or the like. For example, the semiconductor device may be incorporated in bills, coins, securities, certificates, bearer bonds, packing containers, books, recording media, personal belongings, vehicles, foods, clothing, healthcare products, commodities, medicine, electronic devices, and the like. Examples of these products are described with reference to FIGS. 10A to 10G.

The bills and coins are money that circulates in the market, and includes one that can be used in the same way as money in a specific area (cash voucher), a commemorative coin, and the like. The securities refer to checks, certificates, promissory notes, and the like, and can be provided with a chip 1001 including a processor circuit (see FIG. 10A). The certificates refer to driver's licenses, certificates of residence, and the like, and can be provided with a chip 1002 including a processor circuit (see FIG. 10B). The personal belongings refer to bags, glasses, and the like, and can be provided with a chip 1003 including a processor circuit (see FIG. 10C). The bearer bonds refer to stamps, rice coupons, various merchandise coupons, and the like. The packing containers refer to wrapping paper for food containers and the like, plastic bottles, and the like, and can be provided with a chip 1004 including a processor circuit (see FIG. 10D). The books refer to hardbacks, paperbacks, and the like, and can be provided with a chip 1005 including a processor circuit (see FIG. 10E). The recording media refer to DVD software, video tapes, and the like, and can be provided with a chip 1006 including a processor circuit (see FIG. 10F). The vehicles refer to ships, wheeled vehicles such as bicycles, and the like, and can be provided with a chip 1007 including a processor circuit (see FIG. 10G). The food refers to groceries, beverages, and the like. The clothing refers to clothes, shoes, and the like. The healthcare products refer to medical instruments, health instruments, and the like. The commodities refer to furniture, lighting equipment, and the like. The medicine refers to medical drugs, pesticides, and the like. The electronic devices refer to liquid crystal display devices, EL display devices, television devices (television receivers or thin television receivers), cellular phones, and the like.

The semiconductor device can be provided by being attached to the surface of an article or being embedded in an article. For example, in the case of a book, the semiconductor device may be embedded in the paper; and in the case of a package made of an organic resin, the semiconductor device may be embedded in the organic resin.

As described above, the efficiency of an inspection system, a system used in a rental shop, or the like can be improved by providing the packing containers, the recording media, the personal belongings, the food, the clothing, the commodities, the electronic devices, or the like with the semiconductor device. In addition, by providing the vehicles with the semiconductor device, forgery or theft can be prevented. Further, when the semiconductor device is implanted into creatures such as animals, each creature can be identified easily. For example, by implanting/attaching the semiconductor device with a sensor in/to a creature such as livestock, its health condition such as a current body temperature as well as its birth year, sex, breed, or the like can be easily managed.

Embodiment 4 can also be appropriately combined with any other embodiments in this specification.

This application is based on Japanese Patent Application serial no. 2008-247548 filed with the Japan Patent Office on Sep. 26, 2008, the entire contents of which are hereby incorporated by reference.

What is claimed is:

1. A semiconductor device comprising:
an antenna for receiving electric power externally;
a first modulation circuit and a second modulation circuit each for performing load modulation;
a detection circuit for determining an output signal in accordance with a value of the electric power;
a protection circuit whose operation is controlled by a value of the output signal of the detection circuit; and
a modulation selecting circuit selecting one of the first modulation circuit and the second modulation circuit in accordance with the value of the output signal of the detection circuit,
wherein the modulation selecting circuit selects the first modulation circuit when the protection circuit does not operate, and
wherein the modulation selecting circuit selects the second modulation circuit when the protection circuit operates.

2. The semiconductor device according to claim 1,
wherein the second modulation circuit increases amplitude of a subcarrier wave which is made to be small due to operation of the protection circuit.

3. The semiconductor device according to claim 1,
wherein a load included in the second modulation circuit is smaller than a load included in the first modulation circuit.

4. A semiconductor device comprising:
an antenna to which alternating-current voltage is input externally;
a first modulation circuit and a second modulation circuit each performing load modulation;
a rectifier circuit converting the alternating-current voltage into direct-current voltage;
a detection circuit determining an output signal by a value of voltage output from the rectifier circuit;
a protection circuit suppressing output voltage of the rectifier circuit by a value of the output signal of the detection circuit; and
a modulation selecting circuit selecting one of the first modulation circuit and the second modulation circuit depending on the value of the output signal of the detection circuit,
wherein the modulation selecting circuit selects the first modulation circuit when the protection circuit does not operate, and
wherein the modulation selecting circuit selects the second modulation circuit when the protection circuit operates.

5. The semiconductor device according to claim 4,
wherein the second modulation circuit increases amplitude of a subcarrier wave which is made to be small due to operation of the protection circuit.

6. The semiconductor device according to claim 4,
wherein a load included in the second modulation circuit is smaller than a load included in the first modulation circuit.

7. A semiconductor device comprising:
an antenna for receiving electric power externally;
a first modulation circuit and a second modulation circuit each for performing load modulation;
a protection circuit for protecting the semiconductor device;
a modulation selecting circuit selecting one of the first modulation circuit and the second modulation circuit; and
a detection circuit for detecting the electric power, the detection circuit being configured to control operation of the protection circuit and operation of the modulation selecting circuit
wherein the modulation selecting circuit selects the first modulation circuit when the protection circuit does not operate, and
wherein the modulation selecting circuit selects the second modulation circuit when the protection circuit operates.

8. The semiconductor device according to claim 7,
wherein the second modulation circuit increases amplitude of a subcarrier wave which is made to be small due to operation of the protection circuit.

9. The semiconductor device according to claim 7,
wherein a load included in the second modulation circuit is smaller than a load included in the first modulation circuit.

10. A semiconductor device comprising:
an antenna for receiving electric power externally;
a first modulation circuit and a second modulation circuit connected to the antenna each for performing load modulation;
a detection circuit electrically connected to the antenna for detecting the electric power;
a protection circuit connected to the antenna for protecting the semiconductor device; and
a modulation selecting circuit connected to the first modulation circuit, a second modulation circuit and the detection circuit selecting one of the first modulation circuit and the second modulation circuit,
wherein the modulation selecting circuit selects the first modulation circuit when the protection circuit does not operate, and
wherein the modulation selecting circuit selects the second modulation circuit when the protection circuit operates.

11. The semiconductor device according to claim 10,
wherein the second modulation circuit increases amplitude of a subcarrier wave which is made to be small due to operation of the protection circuit.

12. The semiconductor device according to claim 10,
wherein a load included in the second modulation circuit is smaller than a load included in the first modulation circuit.

* * * * *